US008861249B2

(12) United States Patent
Chung

(10) Patent No.: US 8,861,249 B2
(45) Date of Patent: Oct. 14, 2014

(54) CIRCUIT AND SYSTEM OF A LOW DENSITY ONE-TIME PROGRAMMABLE MEMORY

(71) Applicant: Shine C. Chung, San Jose, CA (US)

(72) Inventor: Shine C. Chung, San Jose, CA (US)

( * ) Notice: Subject to any disclaimer, the term of this patent is extended or adjusted under 35 U.S.C. 154(b) by 5 days.

(21) Appl. No.: 13/761,048

(22) Filed: Feb. 6, 2013

(65) Prior Publication Data

US 2013/0201745 A1    Aug. 8, 2013

Related U.S. Application Data

(60) Provisional application No. 61/595,171, filed on Feb. 6, 2012.

(51) Int. Cl.

| | |
|---|---|
| G11C 27/04 | (2006.01) |
| G11C 17/16 | (2006.01) |
| G11C 8/00 | (2006.01) |
| G11C 17/08 | (2006.01) |
| G11C 19/28 | (2006.01) |
| G11C 17/18 | (2006.01) |
| H03K 3/00 | (2006.01) |
| G11C 17/12 | (2006.01) |
| G11C 11/16 | (2006.01) |
| G11C 8/18 | (2006.01) |
| H03K 3/356 | (2006.01) |

(52) U.S. Cl.
CPC ............... *G11C 17/08* (2013.01); *G11C 19/28* (2013.01); *G11C 17/16* (2013.01); *G11C 17/12* (2013.01); *G11C 11/1659* (2013.01); *G11C 11/1675* (2013.01); *G11C 27/04* (2013.01); *G11C 8/18* (2013.01); *G11C 17/18* (2013.01); *H03K 3/00* (2013.01); *H03K 3/35606* (2013.01)
USPC ................... 365/96; 365/189.08; 365/189.12

(58) Field of Classification Search
CPC .... G11C 17/16; G11C 17/12; G11C 11/1659; G11C 11/1675; G11C 27/04; G11C 8/18
USPC .................................. 365/96, 189.08, 189.12
See application file for complete search history.

(56) References Cited

U.S. PATENT DOCUMENTS

| | | |
|---|---|---|
| 3,198,670 A | 8/1965 | Nissim |
| 3,715,242 A | 2/1973 | Daniel |

(Continued)

FOREIGN PATENT DOCUMENTS

| | | |
|---|---|---|
| CN | 1469473 A | 1/2004 |
| CN | 1691204 A | 11/2005 |

(Continued)

OTHER PUBLICATIONS

U.S. Appl. No. 13/471,704, filed May 15, 2012.

(Continued)

*Primary Examiner* — Ly D Pham

(57) ABSTRACT

A low density One-Time Programmable (OTP) memory is disclosed to achieve low gate count and low overhead in the peripheral circuits to save the cost. A maximum-length Linear Feedback Shift Register (LFSR) can be used to generate $2^n-1$ address spaces from an n-bit address. The registers used in the address generator can have two latches. Each latch has two cross-coupled inverters with two outputs coupled to the drains of two MOS input devices, respectively. The inputs of the latch are coupled to the gates of the MOS input devices, respectively. The sources of the MOS input devices are coupled to the drains of at least one MOS device(s), whose gate(s) are coupled to a clock signal and whose source(s) are coupled to a supply voltage. The two latches can be constructed in serial with the outputs of the first latch coupled to the inputs of the second latch.

17 Claims, 14 Drawing Sheets

(56) References Cited

U.S. PATENT DOCUMENTS

| | | | |
|---|---|---|---|
| 4,148,046 A | 4/1979 | Hendrickson et al. |
| 4,192,059 A | 3/1980 | Khan et al. |
| 5,192,989 A | 3/1993 | Matsushita et al. |
| 5,389,552 A | 2/1995 | Iranmanesh |
| 5,635,742 A | 6/1997 | Hoshi et al. |
| 5,962,903 A | 10/1999 | Sung et al. |
| 6,140,687 A | 10/2000 | Shimomura et al. |
| 6,243,864 B1 | 6/2001 | Odani et al. |
| 6,400,540 B1 | 6/2002 | Chang |
| 6,405,160 B1 | 6/2002 | Djaja et al. |
| 6,461,934 B2 | 10/2002 | Nishida et al. |
| 6,483,734 B1 | 11/2002 | Sharma et al. |
| 6,611,043 B2 | 8/2003 | Takiguchi |
| 6,731,535 B1 | 5/2004 | Ooishi et al. |
| 6,770,953 B2 | 8/2004 | Boeck et al. |
| 6,803,804 B2 | 10/2004 | Madurawe |
| 6,813,705 B2 | 11/2004 | Duesterwald et al. |
| 6,944,083 B2 | 9/2005 | Pedlow |
| 6,967,879 B2 | 11/2005 | Mizukoshi |
| 7,212,432 B2 | 5/2007 | Ferrant et al. |
| 7,263,027 B2 | 8/2007 | Kim et al. |
| 7,294,542 B2 | 11/2007 | Okushima |
| 7,391,064 B1 | 6/2008 | Tripsas et al. |
| 7,411,844 B2 | 8/2008 | Nitzan et al. |
| 7,461,371 B2 | 12/2008 | Luo et al. |
| 7,573,762 B2 | 8/2009 | Kenkare et al. |
| 7,696,017 B1 | 4/2010 | Tripsas et al. |
| 7,701,038 B2 | 4/2010 | Chen et al. |
| 7,764,532 B2 | 7/2010 | Kurjanowicz et al. |
| 7,802,057 B2 | 9/2010 | Iyer et al. |
| 7,833,823 B2 | 11/2010 | Klersy |
| 7,889,204 B2 | 2/2011 | Hansen et al. |
| 8,008,723 B2 | 8/2011 | Nagai |
| 8,089,137 B2 | 1/2012 | Lung et al. |
| 8,115,280 B2 | 2/2012 | Chen et al. |
| 8,119,048 B2 | 2/2012 | Nishimura |
| 8,168,538 B2 | 5/2012 | Chen et al. |
| 8,179,711 B2 | 5/2012 | Kim et al. |
| 8,183,665 B2 | 5/2012 | Bertin et al. |
| 8,217,490 B2 | 7/2012 | Bertin et al. |
| 8,369,166 B2 | 2/2013 | Kurjanowicz et al. |
| 8,373,254 B2 | 2/2013 | Chen et al. |
| 8,482,972 B2 | 7/2013 | Chung |
| 8,488,359 B2 | 7/2013 | Chung |
| 8,488,364 B2 | 7/2013 | Chung |
| 8,514,606 B2 | 8/2013 | Chung |
| 8,570,800 B2 | 10/2013 | Chung |
| 2003/0135709 A1 | 7/2003 | Niles et al. |
| 2003/0169625 A1 | 9/2003 | Hush et al. |
| 2004/0057271 A1 | 3/2004 | Parkinson |
| 2004/0113183 A1 | 6/2004 | Karpov et al. |
| 2005/0060500 A1 | 3/2005 | Luo et al. |
| 2005/0110081 A1 | 5/2005 | Pendharkar |
| 2005/0124116 A1 | 6/2005 | Hsu et al. |
| 2005/0146962 A1 | 7/2005 | Schreck |
| 2006/0072357 A1 | 4/2006 | Wicker |
| 2006/0092689 A1 | 5/2006 | Braun et al. |
| 2006/0104111 A1 | 5/2006 | Tripsas et al. |
| 2006/0129782 A1 | 6/2006 | Bansai et al. |
| 2007/0081377 A1 | 4/2007 | Zheng et al. |
| 2007/0133341 A1 | 6/2007 | Lee et al. |
| 2007/0138549 A1 | 6/2007 | Wu et al. |
| 2007/0279978 A1 | 12/2007 | Ho et al. |
| 2008/0025068 A1 | 1/2008 | Scheuerlein et al. |
| 2008/0044959 A1 | 2/2008 | Cheng et al. |
| 2008/0105878 A1 | 5/2008 | Ohara |
| 2008/0151612 A1 | 6/2008 | Pellizzer et al. |
| 2008/0220560 A1 | 9/2008 | Klersy |
| 2009/0055617 A1 | 2/2009 | Bansai et al. |
| 2009/0168493 A1 | 7/2009 | Kim et al. |
| 2009/0172315 A1 | 7/2009 | Iyer et al. |
| 2009/0180310 A1 | 7/2009 | Shimomura et al. |
| 2009/0194839 A1 | 8/2009 | Bertin et al. |
| 2009/0213660 A1 | 8/2009 | Pikhay et al. |
| 2009/0309089 A1 | 12/2009 | Hsia et al. |
| 2010/0091546 A1 | 4/2010 | Liu et al. |
| 2010/0142254 A1 | 6/2010 | Choi et al. |
| 2010/0171086 A1 | 7/2010 | Lung et al. |
| 2010/0232203 A1 | 9/2010 | Chung et al. |
| 2010/0277967 A1 | 11/2010 | Lee et al. |
| 2010/0301304 A1 | 12/2010 | Chen et al. |
| 2011/0128772 A1 | 6/2011 | Kim et al. |
| 2011/0145777 A1 | 6/2011 | Iyer et al. |
| 2011/0260289 A1 | 10/2011 | Oyamada |
| 2011/0297912 A1 | 12/2011 | Samachisa et al. |
| 2011/0312166 A1 | 12/2011 | Yedinak et al. |
| 2012/0032303 A1 | 2/2012 | Elkareh et al. |
| 2012/0044736 A1 | 2/2012 | Chung |
| 2012/0044737 A1 | 2/2012 | Chung |
| 2012/0044738 A1 | 2/2012 | Chung |
| 2012/0044739 A1 | 2/2012 | Chung |
| 2012/0044740 A1 | 2/2012 | Chung |
| 2012/0044743 A1 | 2/2012 | Chung |
| 2012/0044744 A1 | 2/2012 | Chung |
| 2012/0044745 A1 | 2/2012 | Chung |
| 2012/0044746 A1 | 2/2012 | Chung |
| 2012/0044747 A1 | 2/2012 | Chung |
| 2012/0044748 A1 | 2/2012 | Chung |
| 2012/0044753 A1 | 2/2012 | Chung |
| 2012/0044756 A1 | 2/2012 | Chung |
| 2012/0044757 A1 | 2/2012 | Chung |
| 2012/0044758 A1 | 2/2012 | Chung |
| 2012/0047322 A1 | 2/2012 | Chung |
| 2012/0074460 A1 | 3/2012 | Kitagawa |
| 2012/0106231 A1 | 5/2012 | Chung |
| 2012/0147653 A1 | 6/2012 | Chung |
| 2012/0147657 A1 | 6/2012 | Sekar et al. |
| 2012/0209888 A1 | 8/2012 | Chung |
| 2012/0224406 A1 | 9/2012 | Chung |
| 2012/0314472 A1 | 12/2012 | Chung |
| 2012/0314473 A1 | 12/2012 | Chung |
| 2012/0320656 A1 | 12/2012 | Chung |
| 2012/0320657 A1 | 12/2012 | Chung |
| 2013/0148409 A1 | 6/2013 | Chung |
| 2013/0189829 A1 | 7/2013 | Mieczkowski et al. |
| 2013/0200488 A1 | 8/2013 | Chung |
| 2013/0201745 A1 | 8/2013 | Chung |
| 2013/0201746 A1 | 8/2013 | Chung |
| 2013/0201748 A1 | 8/2013 | Chung |
| 2013/0201749 A1 | 8/2013 | Chung |
| 2013/0215663 A1 | 8/2013 | Chung |
| 2013/0235644 A1 | 9/2013 | Chung |
| 2014/0071726 A1 | 3/2014 | Chung |
| 2014/0131710 A1 | 5/2014 | Chung |
| 2014/0131711 A1 | 5/2014 | Chung |
| 2014/0131764 A1 | 5/2014 | Chung |
| 2014/0133056 A1 | 5/2014 | Chung |

FOREIGN PATENT DOCUMENTS

| | | |
|---|---|---|
| CN | 101083227 A | 5/2007 |
| CN | 101057330 A | 10/2007 |
| CN | 101188140 A | 5/2008 |
| CN | 101271881 A | 9/2008 |
| CN | 101483062 A | 7/2009 |
| CN | 101728412 A | 6/2010 |
| JP | 03-264814 | 11/1991 |
| TW | I309081 | 4/2009 |

OTHER PUBLICATIONS

U.S. Appl. No. 13/026,650, filed Feb. 14, 2011.
U.S. Appl. No. 13/026,656, filed Feb. 14, 2011.
U.S. Appl. No. 13/026,664, filed Feb. 14, 2011.
U.S. Appl. No. 13/026,678, filed Feb. 14, 2011.
U.S. Appl. No. 13/026,692, filed Feb. 14, 2011.
U.S. Appl. No. 13/026,704, filed Feb. 14, 2011.
U.S. Appl. No. 13/026,717, filed Feb. 14, 2011.
U.S. Appl. No. 13/026,725, filed Feb. 14, 2011.
U.S. Appl. No. 13/026,752, filed Feb. 14, 2011.
U.S. Appl. No. 13/026,771, filed Feb. 14, 2011.
U.S. Appl. No. 13/026,783, filed Feb. 14, 2011.
U.S. Appl. No. 13/026,835, filed Feb. 14, 2011.

(56) References Cited

OTHER PUBLICATIONS

U.S. Appl. No. 13/026,840, filed Feb. 14, 2011.
U.S. Appl. No. 13/026,852, filed Feb. 14, 2011.
U.S. Appl. No. 13/214,198, filed Aug. 21, 2011.
U.S. Appl. No. 13/590,044, filed Aug. 20, 2012.
U.S. Appl. No. 13/590,047, filed Aug. 20, 2012.
U.S. Appl. No. 13/590,049, filed Aug. 20, 2012.
U.S. Appl. No. 13/590,050, filed Aug. 20, 2012.
U.S. Appl. No. 13/214,183, filed Aug. 20, 2011.
U.S. Appl. No. 13/288,843, filed Nov. 3, 2011.
U.S. Appl. No. 13/314,444, filed Dec. 8, 2011.
U.S. Appl. No. 13/397,673, filed Feb. 15, 2012.
U.S. Appl. No. 13/571,797, filed Aug. 10, 2012.
U.S. Appl. No. 13/678,539, filed Nov. 15, 2012.
U.S. Appl. No. 13/678,544, filed Nov. 15, 2012.
U.S. Appl. No. 13/678,541, filed Nov. 15, 2012.
U.S. Appl. No. 13/678,543, filed Nov. 15, 2012.
Ahn, S.J. et al, "Highly Reliable 50nm Contact Cell Technology for 256Mb PRAM," IEEE VLSI Tech Symp., Jun. 2005, pp. 98-99.
Alavi, Mohsen, et al., "A PROM Element Based on Salicide Allgomeration of Poly Fuses in a CMOS Logic Process," IEEE IEDM, 97, pp. 855-858.
Andre, T. W. et al., "A 4-Mb 0.18um 1T1MTJ Toggle MRAM With Balanced Three Input Sensing Scheme and Locally Mirrored Unidirectional Write Drivers," IEEE J. of Solid-State Circuits, vol. 40, No. 1, Jan. 2005, pp. 301-309.
Ang, Boon et al., "NiSi Polysilicon Fuse Reliability in 65nm Logic CMOS Technology," IEEE Trans. on Dev. Mat. Rel. vol. 7, No. 2, Jun. 2007, pp. 298-303.
Aziz, A. et al., "Lateral Polysilicon n+p Diodes: Effect of the Grain boundaries and of the p-Implemented Doping Level on the I-V and C-V Characteristics," Springer Proceedings in Physics, vol. 54, 1991, pp. 318-322.
Aziz, A. et al., "Lateral Polysilicon PN Diodes: Current-Voltage Characteristics Simulation Between 200K and 400K a Numerical Approach," IEEE Trans. on Elec. Dev., vol. 41, No. 2, Feb. 1994, pp. 204-211.
Banerjee, Kaustav et al., "High Current Effects in Salicide Films for Sub-0.25um VLSI Technologies," IEEE 36th IRPS, 1998, pp. 284-292.
Bedeschi, F. et al., "4-Mb MOSFET-Selected uTrench Phase-Change Memory Experimental Chip," IEEE J. of Solid-State Circuits, vol. 40, No. 7, Jul. 2005, pp. 1557-1565.
Bedeschi, F. et al., "A Bipolar-Selected Phase Change Memory Featuring Multi-Level Cell Storage," IEEE J. Sol. Stat. Cir., vol. 44, No. 1, Jan. 2009, pp. 217-227.
Bedeschi, F. et al., "A Fully Symmetrical Sense Amplifier for Non-volatile Memories," IEEE. Int. Symp. on Circuits and Systems, (ISCAS), vol. 2, 2004, pp. 625-628.
Bedeschi, F. et al., "An 8Mb Demonstrator for High-Density 1.8V Phase-Change Memories," VLIS Cir. Symp, Jun. 2004, pp. 442-445.
Bedeschi, F. et al., "Set and Reset Pulse Characterization in BJT-Selected Phase-Change Memory," IEEE Int. Symp. on Circuits and Systems (ISCAS), 2005, pp. 1270-1273.
Braganca, P. M. et al., "A Three-Terminal Approach to Developing Spin-Torque Written Magnetic Random Access Memory Cells," IEEE Trans. on Nano. vol. 8, No. 2, Mar. 2009, pp. 190-195.
Cagli, C. et al., "Evidence for threshold switching in the set process of NiO-based RRAM and physical modeling for set, reset, retention and disturb prediction," IEEE IEDM, 2008, pp. 1-4.
Chan, W. T. et al., "CMOS Compatible Zero-Mask One-Time Programmable (OTP) Memory Design," Proc. Int. Conf. Solid State Integr. Cir. Tech., Beijing, China, Oct. 20-23, 2008. pp. 861-864.
Chan, Wan Tim, et al., "CMOS Compatible Zero-Mask One Time Programmable Memory Design", Master Thesis, Hong-Kong University of Science and Technologies, 2008.
Chang, Meng-Fan et al., "Circuit Design Challenges in Embedded Memory and Resistive RAM (RRAM) for Mobile SoC and 3D-IC", Design Automation Conference (ASP-DAC), 16th Asia and South Pacific, 2011, pp. 197-203.
Cheng, Yu-Hsing et al., "Failure Analysis and Optimization of Metal Fuses for Post Package Trimming," IEEE 45th IRPS, 2007, pp. 616-617.
Chiu, Pi-Feng et al., "A Low Store Energy, Low VDDmin, Nonvolatile 8T2R SRAM with 3D Stacked RRAM Devices for Low Power Mobile Applications," IEEE VLSI Cir./Tech Symp., Jun. 2010, pp. 229-230.
Cho, Woo Yeong et al., "A 0.18um 3.0V 64Mb Non-Volatile Phase-Transition Random-Access Memory (PRAM)," ISSCC, Feb. 2004, Sec. 2-1.
Choi, Sang-Jun et al., "Improvement of CBRAM Resistance Window by Scaling Down Electrode Size in Pure-GeTe Film," IEEE Elec. Dev., vol. 30, No. 2, Feb. 2009, pp. 120-122.
Choi, Youngdon et al., "A 20nm 1.8V 8Gb PRAM with 40MB/s Program Bandwidth," IEEE ISSCC, 2012, pp. 46-47.
Chung, S. et al., "A 1.25um2 Cell 32Kb Electrical Fuse Memory in 32nm CMOS with 700mV Vddmin and Parallel/Serial Interface," VLSI Cir. Symp., Jun. 2009, pp. 30-31.
Chung, S. et al., "A 512×8 Electrical Fuse Memory with 15um2 Cells Using 8-sq Asymmetrical Fuse and Core Devices in 90nm CMOS," VLSI Cir. Symp., Jun. 2007, pp. 74-75.
Crowley, Matthew et al., "512Mb PROM with 8 Layers of Antifuse/Diode Cells," IEEE ISSCC 2003, Sec. 16.4.
De Sandre, Guido et al., "A 4Mb LV MOS-Selected Embedded Phase Change Memory in 90nm Standard CMOS Technology," IEEE J. Sol. Stat. Cir, vol. 46. No. 1, Jan. 2011, pp. 52-63.
De Sandre, Guido et al., "A 90nm 4Mb Embedded Phase-Change Memory with 1.2V 12ns Read Access Time and 1MB/s Write Throughput," ISSCC 2010, Sec. 14.7.
Desikan, Rajagopalan et al., "On-Chip MRAM as a High-Bandwidth Low-Latency Replacement for DRAM Physical Memories," Tech Report TR-02-47, Dept. of Computer Science, University of Texas, Austin, Sep. 27, 2002, 18 pages.
Dietrich, Stefan et al., "A Nonvolatile 2-Mbit CBRAM Memory Core Featuring Advanced Read and Program Control," IEEE J. of Solid-Stat Cir., vol. 42, No. 4, Apr. 2007, pp. 839-845.
Dion, Michael J., "Reservoir Modeling for Electromigration Improvement of Metal Systems with Refractory Barriers," IEEE 39th IRPS, 2001, pp. 327-333.
Doorn T. S. et al., "Ultra-fast Programming of Silicided Polysilicon Fuses Based on New Insights in the Programming Physics," IEEE IEDM, 2005, pp. 667-670.
Doorn, T. S., "Detailed Qualitative Model for the Programming Physics of Silicided Polysilicon Fuses," IEEE Trans. on Elec. Dev. vol. 54, No. 12, Dec. 2007, pp. 3285-3291.
Durlam, M. et al., "A 1-Mbit MRAM Based on 1T1MTJ Bit Cell Integrated With Copper Interconnects," IEEE J. of Solid-State Circuits, vol. 38, No. 5, May 2003, pp. 769-773.
Engel, B. et al., "The Science and Technology of Magnetoresistive Tunnel Memory," IEEE Tran. on Nanotechnology, vol. 1, No. 1, Mar. 2002, pp. 32-38.
Engel, B.N. et al., "A 4Mb Toggle MRAM Based on a Novel bit and Switching Method," IEEE Trans. on Mag. vol. 41, No. 1, Jan. 2005, pp. 132-136.
Fellner, Johannes, et al., "Lifetime Study for a Poly Fuse in a 0.35um Polycide CMOS Process," IEEE 43rd IRPS, 2005, pp. 446-449.
Gao, B. et al., "Oxide-Based RRAM: Uniformity Improvement Using a New Material-Oriented Methodology," IEEE VLSI Tech. Symp., Jun. 2009, pp. 30-31.
Gao, B. et al., "Oxide-Based RRAM Switching Mechanism: A New Ion-Transport-Recombination Model," IEDM, Dec. 2008, pp. 563-566.
Gill, M. et al., "Ovonic Unified Memory-A High Performance Nonvolatile Memory Technology for Stand-Alone Memory and Embedded Applications," IEEE, ISSCC Dig. of Tech. Paper, Feb. 2002, pp. 202-203.
Gogl, D. et al., "A 16-Mb MRAM Featuring Bootstrapped Write Drivers," IEEE J. of Solid-State Circuits, vol. 40, No. 4, Apr. 2005, pp. 902-908.
Gopalan, C. et al., Demonstration of Conductive Bridging Random Access Memory (CBRAM) in Logic CMOS Process, IEEE Int. Memory Workshop, 2010, pp. 1-4.

(56) References Cited

OTHER PUBLICATIONS

Ha, Daewon and Kim, Kinam, "Recent Advances in High Density Phase Change Memory (PRAM)," IEEE VLSI Tech. Symp. Jun. 2007.
Hosoi, Y. et al., "High Speed Unipolar Switching Resistance RAM (RRAM) Technology," IEEE IEDM, Dec. 2006, pp. 1-4.
Hosomi, M. et al., "A Novel Nonvolatile Memory with Spin Torque Transfer Magnetization Switching: Spin-RAM," IEEE IEDM Dig. of Tech. Paper, Dec. 2005, pp. 459-463.
Huang, Chia-En et al., "A New CMOS Logic Anti-Fuse Cell with Programmable Contact," IEEE IEDM Tech. Dig. 2007, pp. 48-51.
Im, Jay et al., "Characterization of Silicided Polysilicon Fuse Implemented in 65nm CMOS Technology," 7th Annual Non-Volatile Memory Technology Symp, (NVMTS) 2006, pp. 55-57.
Jin, Li-Yan et al., "Low-Area 1-Kb Multi-Bit OTP IP Design," IEEE 8th Int. Conf. on ASIC (ASICON), 2009. pp. 629-632.
Johnson, Mark et al., "512Mb PROM with a Three-Dimensional Array of Diode/Antifuse Memory Cells," IEEE J. of Sol. Stat. Cir., vol. 38, No. 11, Nov. 2003, pp. 1920-1928.
Kalnitsy, Alexander et al., "CoSi2 Integrated Fuses on Poly Silicon for Low Voltage 0.18um CMOS Applications," IEEE IEDM 1999, pp. 765-768.
Kang, Han-Byul et al., "Electromigration of NiSi Poly Gated Electrical Fuse and Its Resistance Behaviors Induced by High Temperature," IEEE IRPS, 2010, pp. 265-270.
Kang, Sangbeom et al., "A 0.1um 1.8V 256Mb Phase-Change Random Access Memory (PRAM) with 66Mhz Synchronous Burst-Read," IEEE J. of Sol. Stat. Cir. vol. 42. No. 1, Jan. 2007, pp. 210-218.
Kawhara, T. et al., "2Mb Spin-Transfer Torque RAM (SPRAM) with Bit-by-Bit Bidirectional Current Write and Parallelizing-Direction Current Read," IEEE ISSCC Dig. of Tech. Paper, Feb. 2007, pp. 480-481.
Ker, Ming-Dou et al., "High-Current Characterization of Polysilicon Diode for Electrostatic Discharge Protection in Sub-Quarter-Micron Complementary Metal Oxide Semiconductor Technology," Jpn. J. Appl. Phys. vol. 42 (2003) pp. 3377-3378.
Ker, Ming-Dou et al., "Ultra-High-Voltage Charge Pump Circuit in Low-Voltage Bulk CMOS Processes With Polysilicon Diodes," IEEE Trans. on Cir. and Sys.-II: Exp. Brief., vol. 54, No. 1, Jan. 2007, pp. 47-51.
Kim, Deok-Kee et al., "An Investigation of Electrical Current Induced Phase Transitions in the NiPtSi/Polysilicon System," J. App. Phy. 103, 073708 (2008).
Kim, I. S. et al., "High Performance PRAM Cell Scalable to sub-20nm Technology with below 4F2 Cell Size, Extendable to DRAM Applications," IEEE VLSI Tech Symp., Jun. 2010, pp. 203-204.
Kim, Jinbong et al., "3-Transistor Antifuse OTP ROM Array Using Standard CMOS Process," IEEE VSLI Cir. Symposium, Jun. 2003, pp. 239-242.
Kim, O. et al., "CMOS trimming circuit based on polysilicon fusing," Elec. Lett. vol. 34, No. 4, pp. 355-356, Feb. 1998.
Klee, V. et al., "A 0.13um Logic-Based Embedded DRAM Technology with Electrical Fuses, Cu Interconnect in SiLK, sub-7ns Random Access Time and its Extension to the 0.10um Generation," IEEE IEDM, 2001, pp. 407-410.
Kothandaramam, C. et al., "Electrically programmable fuse (eFUSE) using electromigration in silicides," IEEE Elec. Dev. Lett., vol. 23, No. 9, pp. 523-525, Sep. 2002.
Kulkarni, S. et al., "High-Density 3-D Metal-Fuse PROM Featuring 1.37um2 1T1R Bit Cell in 32nm High-K Metal-Gate CMOS Technology," VLSI Cir. Symp., Jun. 2009 pp. 28-29.
Kulkarni, S. et al., "A 4Kb Metal-Fuse OTP-ROM Macro Featuring a 2V Programmable 1.37um2 1T1R Bit Cell in 32nm High-K Metal-Gate CMOS," IEEE J. of Sol. Stat. Cir, vol. 45, No. 4, Apr. 2010, pp. 863-868.
Kund, Michael et al., "Conductive Bridging RAM (CBRAM): An Emerging Non-Volatile Memory Technology Scalable to Sub 20nm," IEEE IEDM 2005, pp. 754-757.
Lai, Han-Chao et al., "A 0.26um2 U-Shaped Nitride-Based Programming Cell on Pure 90nm CMOS Technology," IEEE Elec. Dev. Lett. vol. 28, No. 9, Sep. 2007, pp. 837-839.
Lai, S., "Current Status of the Phase Change Memory and Its Future," IEEE IEDM Dig. of Tech. Paper, Dec. 2003, pp. 255-258.
Lee, H.Y. et al., "Low Power and High Speed Bipolar Switching with a Thin Reactive Ti Buffer Layer in Robust HfO2 Based RRAM," IEEE IEDM, 2008, pp. 1-4.
Lee, K.J., et al., "A 90nm 1.8V 512Mb Diode-Switch PRAM with 266MB/s Read Throughout," IEEE ISSCC, Dig. of Tech. Paper, Feb. 2007, 3 pgs.
Lee, Kwang-Jin et al., "A 90nm 1.8V 512Mb Diode-Switch PRAM with 266MB/s Read Throughput," IEEE J. of Sol. Stat. Cir., vol. 43, No. 1, Jan. 2008, pp. 150-162.
Lee, M.-J. et al., "Stack Friendly all-Oxide 3D RRAM Using GaInZnO Peripheral TFT Realized Over Glass Substrates," IEDM, Dec. 2008. pp. 1-4.
Lee, Man Chiu et al., "OTP Memory for Low Cost Passive RFID Tags," IEEE Conf. on Electron Devices and Solid-State Circuits (EDSSC), 2007, pp. 633-636.
Liaw, Corvin et al., "The Conductive Bridging Random Access Memory (CBRAM): A Non-volatile Multi-Level Memory Technology," 37th European Solid-State Device Research Conference (ESSDERC), 2007, pp. 226-229.
Lim, Kyunam et al., "Bit Line Coupling Scheme and Electrical Fuse Circuit for Reliable Operation of High Density DRAM," IEEE VLSI Cir. Symp. Jun. 2001, pp. 33-34.
Maffitt, T. et al., "Design Considerations for MRAM," IBM J. Res. & Dev., vol. 50, No. 1, Jan. 2006, pp. 25-39.
Meng, X.Z. et al., "Reliability Concept for Electrical Fuses," IEE Proc.-Sci Meas. Technol., vol. 144, No. 2, Mar. 1997, pp. 87-92.
Min, Byung-Jun et al., "An Embedded Non-volatile FRAM with Electrical Fuse Repair Scheme and One Time Programming Scheme for High Performance Smart Cards," IEEE CICC, Nov. 2005, pp. 255-258.
Mojumder, N. N. et al., "Three-Terminal Dual-Pillar STT-MRAM for High Performance Robust Memory Applications," IEEE Trans. Elec. Dev. vol. 58. No. 5, May 2011, pp. 1508-1516.
Morimoto, T. et al., "A NiSi Salicide Technology for Advanced Logic Devices," IEEE IEDM, Dec. 1991, pp. 653-656.
Neale, Ron, "PCM Progress Report No. 6 Afterthoughts," http://www.eetimes.com/General/PrintView/4236240, Feb. 13, 2012, 5 pages.
Nebashi, R. et al., "A 90nm 12ns 32Mb 2T1MTJ MRAM," IEEE ISSCC Dig. of Tech. Paper, Sess. 27.4, Feb. 2009, 3 pages.
Ng, K.P. et al., "Diode-Base Gate Oxide Anti-Fuse One-Time Programmable Memory Array in Standard CMOS Process," IEEE Int. Conf. of Elect. Dev. & Solid-Stat Cir. (EDSSC), Dec. 2009, pp. 457-460.
Ohbayashi, Shigeki et al., "A 65nm Embedded SRAM With Wafer Level Burn-In Mode, Leak-Bit Redundancy and Cu E-Trim Fuse for Known Good Die," IEEE J. of Solid. Stat. Cir., vol. 43, No. 1, Jan. 2008, pp. 96-108.
Oh, G. H. et al., "Parallel Multi-Confined (PMC) Cell Technology for High Density MLC PRAM," IEEE VLSI Tech. Symp., Jun. 2009, pp. 220-221.
Oh, J. H. et al., "Full Integration of Highly Manufacturable 512Mb PRAM Based on 90nm Technology," IEEE IEDM Dig. of Tech. Paper, Dec. 2006, pp. 1-4.
Osada, K. et al., "Phase Change RAM Operated with 1.5V CMOS as Low Cost Embedded Memory," IEEE CICC, Nov. 2005, pp. 431-434.
Park, Don et al., "Study on Reliability of Metal Fuse for Sub-100nm Technology," IEEE Int. Symp. on Semiconductor Manufacturing (ISSM), 2005, pp. 420-421.
Park, Jongwoo et al., "Phase Transformation of Programmed NiSi Electrical Fuse: Diffusion, Agglomeration, and Thermal Stability," 18th IEEE Int. Symp. on Physical and Failure Analysis of Integrated Circuits, (IPFA), 2011, pp. 1-7.
Park, Young-Bae et al., "Design of an eFuse OTP Memory of 8 Bits Based on a 0.35um BCD Process," Mobile IT Convergence (ICMIC), 2011 Int. Conf. on, pp. 137-139.

(56) References Cited

OTHER PUBLICATIONS

Pellizzer, F. et al., "Novel uTrench Phase-Change Memory Cell for Embedded and Stand-alone Non-Volatile Memory Applications," IEEE VLSI Tech Symp. Jun. 2004, pp. 18-19.
Peng, J. et al., "A Novel Embedded OTP NVM Using Standard Foundry CMOS Logic Technology," IEEE 21st Non-Volatile Semiconductor Memory Workshop (NVSMW) 2006, pp. 24-26.
Rizzolo, R. F. et al., "IBM System z9 eFUSE applications and methodology," IBM J. Res. & Dev. vol. 51 No. ½ Jan./Mar. 2007, pp. 65-75.
Robson, Norm et al., "Electrically Programmable Fuse (eFuse) from Memory Redundancy to Autonomic Chips," IEEE CICC, 2007, pp. 799-804.
Russo, U. et al., "Conductive-Filament Switching Analysis and Self-Accelerated Thermal Dissolution Model for Reset in NiO-based RRAM," IEDM, Dec. 2007, pp. 775-778.
Safran, J. et al., "A Compact eFUSE Programmable Array Memory for SOI CMOS," VLSI Cir. Symp. Jun. 2007, pp. 72-73.
Sasaki, Takahiko et al., "Metal-Segregate-Quench Programming of Electrical Fuse," IEEE 43rd IRPS, 2005, pp. 347-351.
Schrogmeier, P. et al., "Time Discrete Voltage Sensing and Iterative Programming Control for a 4F2 Multilevel CBRAM," VLSI Cir. Symp., Jun. 2007, pp. 186-187.
Sheu, Shyh-Shyuan et al., "A 5ns Fast Write Multi-Level Non-Volatile 1K-bits RRAM Memory with Advance Write Scheme," VLSI Cir. Symp., Jun. 2009, pp. 82-83.
Sheu, Shyh-Shyuan et al., "Fast-Write Resistive RAM (RRAM) for Embedded Applications," IEEE Design & Test of Computers, Jan./Feb. 2011, pp. 64-71.
Shi, Min et al., "Zero-Mask Contact Fuse for One-Time-Programmable Memory in Standard CMOS Processes," IEEE Dev. Lett. vol. 32, No. 7, Jul. 2011, pp. 955-957.
Song, Y. J. et al., "Highly Reliable 256Mb PRAM with Advanced Ring Contact Technology and Novel Encapsulating Technology," IEEE VLSI Tech Symp., Jun. 2006, pp. 153-154.
Suto, Hiroyuki et al., "Programming Conditions for Silicided Poly-Si or Copper Electrically Programmable Fuses," IEEE IIRW Final Report, 2007, pp. 84-89.
Suto, Hiroyuki et al., "Study of Electrically Programmable Fuses Through Series of I-V Measurements," IEEE IIRW Final Report, 2006, pp. 83-86.
Suto, Hiroyuki et al., "Systematic Study of the Dopant-Dependent Properties of Electrically Programmable Fuses With Silicide Poly-Si Links Through a Series of I-V Measurements," IEEE Trans. on Dev. Mat. Rd. vol. 7, No. 2, Jun. 2007, pp. 285-297.
Takaoka, H. et al., A Novel Via-fuse Technology Featuring Highly Stable Blow Operation with Large On-off Ratio for 32nm Node and Beyond, IEDM, 2007, pp. 43-46.
Tehrani, S. et al., "Magnetoresistive Random Access Memory Using Magnetic Tunnel Junction," Proc. of IEEE, vol. 91, No. 5, May 2003, pp. 703-714.
Tehrani, S., "Status and Outlook of MRAM Memory Technology," IEEE IEDM Dig. of Tech Paper., Dec. 2006, pp. 1-4.
Teichmann, J. et al., "One Time Programming (OTP) with Zener Diodes in CMOS Processes," 33rd Conf. on European Solid-State Device Research (ESSDERC), 2003, pp. 433-436.
Tian, C. et al., "Reliability Investigation of NiPtSi Electrical Fuse with Different Programming Mechanisms," IEEE IIRW Final Report, 2007, pp. 90-93.
Tian, C. et al., "Reliability Qualification of CoSi2 Electrical Fuse for 90nm Technology," IEEE 44th IRPS, 2006, pp. 392-397.
Tian, Chunyan et al., "Reliability Investigation of NiPtSi Electrical Fuse with Different Programming Mechanisms," IEEE Trans. on Dev. Mat. Rel. vol. 8, No. 3, Sep. 2008, pp. 536-542.
Tonti, W. R. et al., "Product Specific Sub-Micron E-Fuse Reliability and Design Qualification," IEEE IIRW Final Report, 2003, pp. 36-40.
Tonti, W. R., "Reliability and Design Qualification of a Sub-Micro Tungsten Silicide E-Fuse," IEEE IRPS Proceedings, 2004, pp. 152-156.
Tonti, W. R., "Reliability, Design Qualification, and Prognostic Opportunity of in Die E-Fuse," IEEE Conference on Prognostics and Health Management (PHM), 2011, pp. 1-7.
Ueda, T. et al., "A Novel Cu Electrical Fuse Structure and Blowing Scheme utilizing Crack-assisted Mode for 90-45nm-node and beyond," IEEE VLSI Tech. Sym., Jun. 2006, 2 pages.
Ulman, G. et al., "A Commercial Field-Programmable Dense eFUSE Array Memory with 00.999% Sense Yield for 45nm SOI CMOS", ISSCC 2008/ Session 22 / Variation Compensation and Measurement/ 22.4, 2008 IEEE International Solid-State Circuits Conference, pp. 406-407.
Vimercati, Daniele et al., "A 45nm 1Gbit 1.8V PCM for Wireless and Embedded Applications," IEEE ISSCC Feb. 2010, 26 pages.
Vinson, J. E., "NiCr Fuse Reliability—A New Approach," Southcon/ 94, Conference Record, 1994, pp. 250-255.
Walko, J., "Ovshinsky's Memories," IEE Review, Issue 11, Nov. 2005, pp. 42-45.
Wang, J. P. et al., "The Understanding of Resistive Switching Mechansim in HfO2-Based Resistive Random Access Memory," IEDM, 2011, pp. 12.1.1-12.1.4.
Wikipedia, "Programmable read-only memory", http://en.wikipedia.org/wiki/Programmable_read-only_memory, downloaded Jan. 31, 2010, 4 pages.
Worledge, D.C., "Single-Domain Model for Toggle MRAM," IBM J. Res. & Dev. vol. 50, No. 1, Jan. 2006, pp. 69-79.
Wu, Kuei-Sheng et al., "The Improvement of Electrical Programmable Fuse with Salicide-Block Dielectrical Film in 40nm CMOS Technology," Interconnect Technology Conference (IITC), 2010 Int. pp. 1-3.
Wu, Kuei-Sheng et al., "Investigation of Electrical Programmable Metal Fuse in 28nm and beyond CMOS Technology," IEEE International Interconnect Technology Conference and 2011 Materials for Advanced Metallization (IITC/MAM), 2011, pp. 1-3.
Yin, M. et al., "Enhancement of Endurance for CuxO based RRAM Cell," 9th Int. Conf. on Solid-State and Integrated-Circuit Technology (ICSICT) 2008, pp. 917-920.
Zhu, Jian-Gang, "Magnetoresistive Random Access Memory: The Path to Competitiveness and Scalability," Proc. of IEEE, vol. 96, No. 11, Nov. 2008, pp. 1786-1798.
Zhuang, W. W. et al., "Novell Colossal Magnetonresistive Thin Film Nonvolatile Resistance Random Access Memory (RRAM)," IEEE IEDM 2002, pp. 193-196.
Notice of Allowance for U.S. Appl. No. 13/026,664 mailed Sep. 18, 2012.
Office Action for U.S. Appl. No. 13/471,704 mailed Jul. 31, 2012.
Notice of Allowance for U.S. Appl. No. 13/471,704 mailed Oct. 18, 2012.
Notice of Allowance for U.S. Appl. No. 13/026,678 mailed Sep. 19, 2012.
Office Action for U.S. Appl. No. 13/026,783 mailed Sep. 27, 2012.
Office Action for U.S. Appl. No. 13/026,717 mailed Oct. 25, 2012.
Office Action for U.S. Appl. No. 13/026,650 mailed Nov. 9, 2012.
Office Action for U.S. Appl. No. 13/026,692 mailed Nov. 9, 2012.
Office Action for U.S. Appl. No. 13/026,752 mailed Nov. 9, 2012.
Office Action for U.S. Appl. No. 13/026,656 mailed Nov. 13, 2012.
Office Action for U.S. Appl. No. 13/026,704 mailed Nov. 23, 2012.
Office Action for U.S. Appl. No. 13/397,673, mailed Dec. 18, 2012.
Office Action for U.S. Appl. No. 13/026,840, mailed Dec. 31, 2012.
Office Action for U.S. Appl. No. 13/026,852, mailed Jan. 14, 2013.
Office Action for U.S. Appl. No. 13/026,783, mailed Sep. 27, 2012.
Restriction Requirement for U.S. Appl. No. 13/026,835, mailed Dec. 12, 2012.
Notice of Allowance for U.S. Appl. No. 13/026,717, mailed Feb. 12, 2013.
Office Action for U.S. Appl. No. 13/471,704, mailed Jan. 25, 2013.
U.S. Appl. No. 13/761,048, filed Feb. 6, 2013.
U.S. Appl. No. 13/761,057, filed Feb. 6, 2013.
U.S. Appl. No. 13/761,097, filed Feb. 6, 2013.
U.S. Appl. No. 13/761,045, filed Feb. 6, 2013.
Office Action for U.S. Appl. No. 13/026,678, mailed Feb. 20, 2013.
Notice of Allowance for U.S. Appl. No. 13/026,783, mailed Mar. 4, 2013.

(56) References Cited

OTHER PUBLICATIONS

Notice of Allowance for U.S. Appl. No. 13/026,692, mailed Mar. 15, 2013.
Office Action for U.S. Appl. No. 13/026,704, mailed Nov. 23, 2012.
Notice of Allowance for U.S. Appl. No. 13/026,835, mailed Mar. 20, 2013.
Notice of Allowance for U.S. Appl. No. 13/026,664, mailed Apr. 22, 2013.
Notice of Allowance for U.S. Appl. No. 13/026,656, mailed Apr. 22, 2013.
Jagasivamani et al., "Development of a Low-Power SRAM Compiler", IEEE Press, 2001, pp. 498-501.
Liu et al., "A Flexible Embedded SRAM Compiler", IEEE Press, 2002, 3 pgs.
Sundrararajan, "OSUSPRAM: Design of a Single Port SRAM Compiler in NCSU FREEPDK45 Process", Mater of Science in Electrical Engineering, Oklahoma State University, Jul. 2010, 117 pgs.
Notice of Allowance for U.S. Appl. No. 13/026,835, Mailed Apr. 18, 2013.
Notice of Allowance for U.S. Appl. No. 13/026,704, mailed Apr. 30, 2013.
Notice of Allowance for U.S. Appl. No. 13/026,852, mailed May 10, 2013.
Notice of Allowance for U.S. Appl. No. 13/026,717, mailed May 15, 2013.
Notice of Allowance for U.S. Appl. No. 13/471,704, mailed May 22, 2013.
Notice of Allowance for U.S. Appl. No. 13/026,678, mailed May 28, 2013.
Notice of Allowance for U.S. Appl. No. 13/026,650, mailed May 30, 2013.
Restriction Requirement for U.S. Appl. No. 13/314,444, mailed Jun. 7, 2013.
Restriction Requirement for U.S. Appl. No. 13/214,198, mailed Jun. 13, 2013.
Notice of Allowance for U.S. Appl. No. 13/026,840, mailed Jun. 13, 2013.
Restriction Requirement for U.S. Appl. No. 13/026,771, mailed Jun. 13, 2013.
Notice of Allowance for U.S. Appl. No. 13/026,752, mailed Jul. 1, 2013.
Restriction Requirement for U.S. Appl. No. 13/678,543, mailed Jul. 8, 2013.
Office Action for U.S. Appl. No. 13/026,725, mailed Jul. 19, 2013.
Notice of Allowance for U.S. Appl. No. 13/026,664, mailed Jul. 22, 2013.
Notice of Allowance for U.S. Appl. No. 13/026,692, mailed Jul. 23, 2013.
Notice of Allowance for U.S. Appl. No. 13/397,673, mailed Jul. 30, 2013.
Notice of Allowance for U.S. Appl. No. 13/026,704, mailed Aug. 2, 2013.
Notice of Allowance for U.S. Appl. No. 13/026,783, mailed Aug. 5, 2013.
Office Action for U.S. Appl. No. 13/214,198, mailed Aug. 6, 2013.
Office action for Chinese Patent Application No. 201110279954.7, mailed Jul. 1, 2013.
Shen et al., "High-K Metal Gate Contact RRAM (CRRAM) in Pure 28 nm CMOS Logic Process", Electron Devices Meeting (IEDM), 2012 IEEE International, Dec. 2012, 4 pgs.
Tseng et al., "A New High-Density and Ultrasmall-Cell Size Contact RRAM (CR-RAM) with Fully CMOS-Logic-Compatible Technology and Circuits", IEEE Transactions on Electron Devices, vol. 58, Issue 1, Jan. 2011, 6 pgs.
Office Action for U.S. Appl. No. 13/026,783, mailed Sep. 9, 2013.
Office Action for U.S. Appl. No. 13/314,444, mailed Sep. 9, 2013.
Office Action for U.S. Appl. No. 13/026,771, mailed Sep. 9, 2013.
Notice of Allowance for U.S. Appl. No. 13/026,852, mailed Sep. 18, 2013.
Office Action (Ex Parte) for U.S. Appl. No. 13/678,543, mailed Sep. 20, 2013.
Office Action for U.S. Appl. No. 13/835,308, mailed Sep. 27, 2013.
Notice of Allowance for U.S. Appl. No. 13/026,717, mailed Oct. 1, 2013.
Office Action for U.S. Appl. No. 13/954,831, mailed Oct. 1, 2013.
Notice of Allowance for U.S. Appl. No. 13/026,656, mailed Oct. 4, 2013.
Office Action for U.S. Appl. No. 13/214,183, mailed Oct. 25, 2013.
Chua, "Many Times Programmable z8 Microcontroller", e-Gizmo.cim, Nov. 21, 2006, pp. 1-5.
Forum, Intel Multi-byte Nops, asmcommunity.net, Nov. 21, 2006, pp. 1-5.
CMOS Z8 OTP Microcontrollers Product Specification, Zilog Inc., May 2008, Revision 1, pp. 1-84.
OTP Programming Adapter Product User Guide, Zilog Inc., 2006, pp. 1-3.
Notice of Allowance for U.S. Appl. No. 13/026,852, mailed Nov. 15, 2013.
Notice of Allowance for U.S. Appl. No. 13/026,835, mailed Nov. 22, 2013.
Notice of Allowance for U.S. Appl. No. 13/026,725, mailed Dec. 10, 2013.
Office Action for U.S. Appl. No. 13/026,783, mailed Dec. 23, 2013.
Notice of Allowance for U.S. Appl. No. 13/026,771, mailed Jan. 15, 2014.
Office Action for Chinese Patent Application No. 201110244362.1, mailed Sep. 29, 2013.
Office Action for Chinese Patent Application No. 201110235464.7, mailed Oct. 8, 2013.
Office Action for Chinese Patent Application No. 201110244400.3, mailed Nov. 5, 2013.
Office Action for Chinese Patent Application No. 201110244342.4, mailed Oct. 31, 2013.
Restriction Requirement for U.S. Appl. No. 13/678,541, mailed Feb. 28, 2014.
Notice of Allowance for U.S. Appl. No. 13/026,840, mailed Mar. 6, 2014.
Notice of Allowance for U.S. Appl. No. 13/026,840, mailed Mar. 10, 2014.
Notice of Allowance of U.S. Appl. No. 13/678,543, mailed Dec. 13, 2013.
Notice of Allowance for U.S. Appl. No. 13/835,308, mailed Mar. 14, 2014.
Notice of Allowance for U.S. Appl. No. 13/026,835, mailed Mar. 14, 2014.
Notice of Allowance for U.S. Appl. No. 13/026,725, mailed Mar. 31, 2014.
Notice of Allowance for U.S. Appl. No. 13/026,852, mailed Mar. 20, 2014.
Notice of Allowance for U.S. Appl. No. 13/026,771, mailed Mar. 18, 2014.
Final Office Action for U.S. Appl. No. 13/214,183, mailed Apr. 17, 2014.
"Embedded Systems/Mixed C and Assembly Programming", Wikibooks, Aug. 6, 2009, pp. 1-7.
Notice of Allowance for U.S. Appl. No. 13/761,097, mailed Jul. 15, 2014.
Office Action for U.S. Appl. No. 13/571,797, mailed Apr. 24, 2014.

Primitive polynomials with minimum # of XORs

| Degree ($n$) | Polynomial |
|---|---|
| 2,3,4,6,7,15,22 | $x^n + x + 1$ |
| 5,11,21,29 | $x^n + x^2 + 1$ |
| 8,19 | $x^n + x^6 + x^5 + x + 1$ |
| 9 | $x^n + x^4 + 1$ |
| 10,17,20,25,28 | $x^n + x^3 + 1$ |
| 12 | $x^n + x^7 + x^4 + x^3 + 1$ |
| 13,24 | $x^n + x^4 + x^3 + x + 1$ |
| 14 | $x^n + x^{12} + x^{11} + x + 1$ |
| 16 | $x^n + x^5 + x^3 + x^2 + 1$ |
| 18 | $x^n + x^7 + 1$ |
| 23 | $x^n + x^5 + 1$ |
| 26,27 | $x^n + x^8 + x^7 + x + 1$ |
| 30 | $x^n + x^{16} + x^{15} + x + 1$ |

FIG. 6

CIRCUIT AND SYSTEM OF A LOW DENSITY ONE-TIME PROGRAMMABLE MEMORY

CROSS-REFERENCE TO RELATED APPLICATION

This application claims priority benefit of an U.S. Provisional Application No. 61/595,171, filed on Feb. 6, 2012 and entitled "CIRCUIT AND SYSTEM OF A LOW DENSITY ONE-TIME PROGRAMMABLE MEMORY," which is hereby incorporated herein by reference.

BACKGROUND OF THE INVENTION

One-Time Programmable (OTP) memory is a memory that can be programmed once and only once. An OTP can be programmed from low to high resistance states, the so-called fuse, such as electrical fuse. Alternatively, an OTP can be programmed from high to low resistance states, the so-called anti-fuse. The programming means can apply a high voltage to an OTP element such as in anti-fuse. Alternatively, the programming means can apply a high current to flow through an OTP element such as in fuse. The OTP memory cell usually has a program selector coupled to an OTP element to switch the desirable OTP element to conduct a high current or high voltage applied.

An electrical fuse is a common OTP that can be constructed from a segment of interconnect, such as polysilicon, silicided polysilicon, silicide, metal, metal alloy, or some combination thereof. The metal can be aluminum, copper, other transition metals, or the non-aluminum metal gate for CMOS. One of the most commonly used electrical fuses is a CMOS gate, fabricated in silicided polysilicon, used as interconnect. The electrical fuse can also be one or more contacts or vias instead of a segment of interconnect. A high current may blow the contact(s) or via(s) into a very high resistance state. The OTP element can be an anti-fuse, where a high voltage makes the resistance lower, instead of higher. The anti-fuse can consist of one or more contacts or vias with an insulator in between. The anti-fuse can also be a CMOS gate coupled to a CMOS body with a thin gate oxide as insulator.

A conventional OTP memory cell is shown in FIG. 1. The cell 10 consists of an OTP element 11 and an NMOS program selector 12. The OTP element 11 is coupled to the drain of the NMOS 12 at one end, and to a positive voltage V+ at the other end. The gate of the NMOS 12 is coupled to a select signal (Sel), and the source is coupled to a negative voltage V−. When a high voltage is applied to V+ and a low voltage to V−, the OTP device 10 can be programmed by raising the select signal (Sel) to turn on the NMOS 12. One of the most common OTP elements is a silicided polysilicon, the same material and fabricated at the same time as a MOS gate. The size of the NMOS 12, as program selector, needs to be large enough to deliver the required program current for a few microseconds. The program current for a silicided polysilicon is normally between a few milliamps for a fuse with width of 40 nm to about 20 mA for a fuse with width about 0.6 um. As a result, the cell size of an electrical fuse using silicided polysilicon tends to be very large. The OTP cells 10 are usually organized as a two-dimensional array with all V+'s in the same columns coupled together as bitlines (BLs) and all Sel's in the same row coupled together as wordlines (WLs).

Another OTP memory cell 15 is shown in FIG. 1(b). The OTP memory cell has an OTP element 16 and a diode 17 as program selector. The OTP element 16 is coupled between an anode of the diode 17 and a high voltage V+. A cathode of the diode 17 is coupled to a low voltage V−. By applying a proper voltage between V+ and V− for a proper duration of time, the OTP element 16 can be programmed into high or low resistance states, depending on voltage/current and duration. The diode 17 can be a junction diode constructed from a P+ active region on N well and an N+ active region on the same N well as the P and N terminals of a diode, respectively. In another embodiment, the diode 17 can be a diode constructed from a polysilicon structure with two ends implanted by P+ and N+, respectively. The P or N terminal of either junction diode or polysilicon diode can be implanted by the same source or drain implant in CMOS devices. Either the junction diode or polysilicon diode can be built in standard CMOS processes without any additional masks or process steps. The OTP cells 15 can be organized as a two-dimensional array with all V+'s in the same columns coupled together as bitlines (BLs) and all Sel's in the same rows coupled together as wordline bars (WLBs).

Low density OTP memory (e.g. bit count no more than 256) can be used for chip ID, inventory control, parameter trimming, or configuration settings for SoC integration. Since the low density OTP size is very small, it is imperative having low pin count to further saving the overall size. To reduce pin count, the interface is better to be serial to save many address signals. The addresses are usually incremented or decremented automatically from a starting address after each access cycle.

FIG. 2(a) shows a block diagram of a typical 4-bit counter 20 that has T-type flip-flops 21-24 (TFF1-4), AND gates 25 and 26 coupled between TFF2-TFF3 and TFF3-TFF4, respectively. FIG. 2(b) shows a schematic 30 of a typical T flip-flop constructed from a D flip-flop 31 with an XOR 32. FIG. 3 shows a schematic of a typical D flip-flop 35 in almost any textbooks on CMOS circuit design. The DFF 35 is implemented as two stages of latches 36 and 37 gated by clocks with opposite phases. The total transistor count of the typical DFF in FIG. 3 is 24, or called 24T. An additional XOR (4T) and an AND gate (6T) are needed to construct a counter stage in FIGS. 2(a),(b) for a total of 34T, except that the first two counter stages can be simplified.

For a low density OTP, as small as 8-bit to 256-bit, designing the peripheral circuits needs to be very effective; otherwise the overhead would be very high. The counter and flip-flop according to the conventional designs are very ineffective. Hence, there is a need for an invention to achieve highly effective design for a low density OTP.

SUMMARY

The present invention relates to effective circuit and system designs for testing a one-time-programmable (OTP) memory. Embodiments of highly effective circuits and systems for low density OTPs are disclosed. Inventions to replace the conventional counters and flip-flop designs can greatly reduce OTP memory size and save cost.

In one embodiment, the counter to generate the next addresses can be replaced by a Linear Feedback Shift Register (LFSR) to save additional gates to implement T-flip-flops and to increment/decrement the addresses. A properly designed n-bit LFSR can generate addresses up to $2^n-1$ with minimum gate overheads, though the addresses generated are not in increment or decrement manners. In another embodiment, the conventional latch can be designed as two cross-coupled inverters with NMOS input devices that are in serial with at least one NMOS pulldown, which is further gated with a clock to ground. Two stages of latches can be used to construct a DFF, clocked by opposite phases. The new DFF has only 16T, comparing with 24T in the conventional DFF design.

The invention can be implemented in numerous ways, including as a method, system, device, or apparatus (including graphical user interface and computer readable medium). Several embodiments of the invention are discussed below.

As a One-Time Programmable (OTP) memory, one embodiment can, for example, include at least a plurality of OTP cells. The at least one of the OTP cells includes at least: an OTP element fabricated in standard CMOS process; at least one address generator having a plurality of registers constructed as shift registers with the last shift register coupled to the first shift register and operating at each clock cycle; and at least one Exclusive OR (XOR) or equivalent gate being coupled as an input to a shift register and an output from a second shift register, while the other input of the XOR being coupled to a third shift register. The output of the shift registers being used as an address to access the OTP memory in each clock cycle.

As an embodiment in an integrated circuit, one embodiment can, for example, include at least one register constructed as a linear feedback shift register (LFSR) with the register outputs used as addresses to access an OTP memory array. The LFSR can be properly designed to reach maximum length of $2^n-1$ for an n-bit LFSR. The DFF can be embodied as latches in two stages. Each latch has two cross-coupled inverters with two outputs having NMOS input devices that are in serial with at least one NMOS pulldowns, which is gated with a clock to ground. The inputs to the latches are coupled to the gates of the NMOS input devices. The outputs of the first latch are coupled to the inputs of the second latch. The clocks in the two latches have opposite phases.

As an electronics system, one embodiment can, for example, include at least a processor, and an OTP memory operatively connected to the processor. The OTP memory can include at least one register constructed as a linear feedback shift register (LFSR) with the register outputs used as addresses to access an OTP memory array. The LFSR can be properly designed to reach maximum length of $2^n-1$ for an n-bit LFSR. The DFF can be embodied as latches in two stages. Each latch has two cross-coupled inverters with two outputs having two NMOS input devices in serial with at least one NMOS pulldowns, which is gated with a clock to ground. The inputs to the latches are coupled to the gates of the NMOS input devices. The outputs of the first latch are coupled to the inputs of the second latch. The clocks in the two latches have opposite phases.

As a method for providing effective embodiments for an OTP memory, one embodiment can, for example, include at least one register constructed as a linear feedback shift register (LFSR) with the register outputs used as addresses to access an OTP memory array. The LFSR can be properly designed to reach maximum length of $2^n-1$ for an n-bit LFSR. The DFF can be embodied as latches in two stages. Each latch has two cross-coupled inverters with two outputs having two NMOS input devices in serial with at least one NMOS pulldowns, which is gated with a clock to ground. The inputs to the latches are coupled to the gates of the NMOS input devices. The outputs of the first latch are coupled to the inputs of the second latch. The clocks in the two latches have opposite phases.

BRIEF DESCRIPTION OF THE DRAWINGS

The present invention will be readily understood by the following detailed descriptions in conjunction with the accompanying drawings, wherein like reference numerals designate like structural elements, and in which:

FIG. 6 shows a table of maximum-length LFSRs with n up to 30.

DETAILED DESCRIPTION OF EMBODIMENTS OF THE INVENTION

Embodiments disclosed herein use innovations to reduce gate counts for a low density OTP memory. A counter with high gate count is replaced by a Linear Feedback Shift Register (LFSR) to generate addresses in a serial OTP memory. LFSR can generate almost the entire available address spaces with a proper design, except the all 0s state. The all 0s state can be multiplexed in and out at any time to reach the entire $2^n$ address spaces, the same effect as a counter, except that the addresses are not generated incremented or decremented but in a seemingly pseudo-random manner. Either counter or LFSR can be designed based on D-type flip-flops (DFFs). The conventional design for DFFs is based on pass gates to drive a pair of cross-coupled inverters that needs about 24 transistors (24T). A better DFF can be designed with two latches. Each latch has a pair of cross-coupled inverters as two outputs coupled to drains of a pair of NMOS input devices. The gates of the NMOS input devices are coupled to the differential inputs. The sources of NMOS input devices are coupled to the drain of at least one NMOS pulldown whose gate is coupled to a clock and whose source is coupled to ground. The two latches can be cascaded with the outputs of the first latch coupled to the inputs of the second latch to constitute a DFF. The clocks for the two latches have opposite phases. The new DFF has about only ⅔ of gate count as the conventional DFF.

Figure 1A:
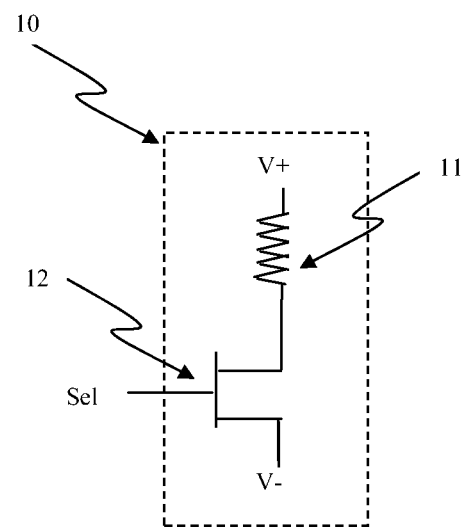
FIG. 1(a) shows a conventional OTP memory cell using MOS as program selector.
Figure 1B:
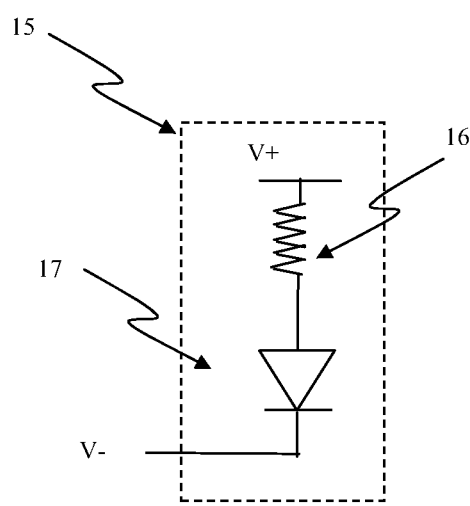
FIG. 1(b) shows another OTP memory cell using diode as program selector.
Figure 2A:
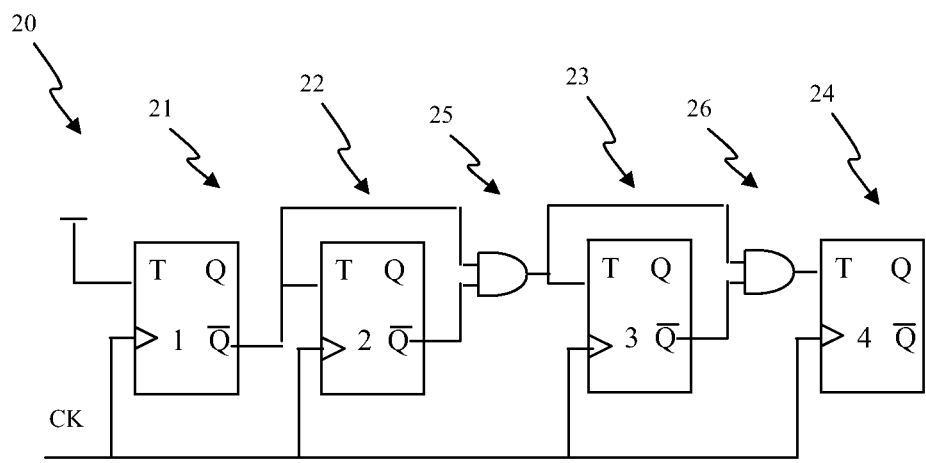
FIG. 2(a) shows a schematic of a 4-bit counter.
Figure 2B:
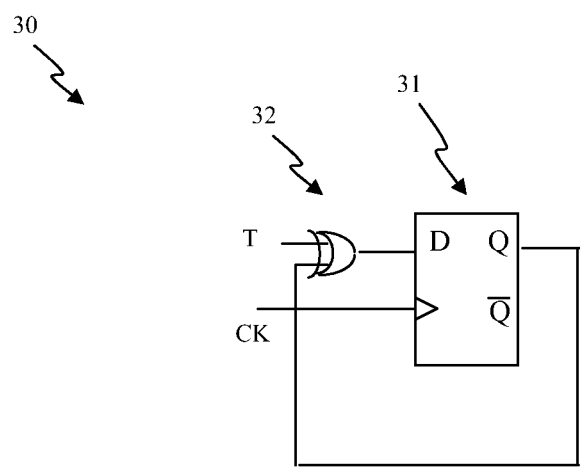
FIG. 2(b) shows a schematic of a TFF constructed from a DFF.
Figure 3:
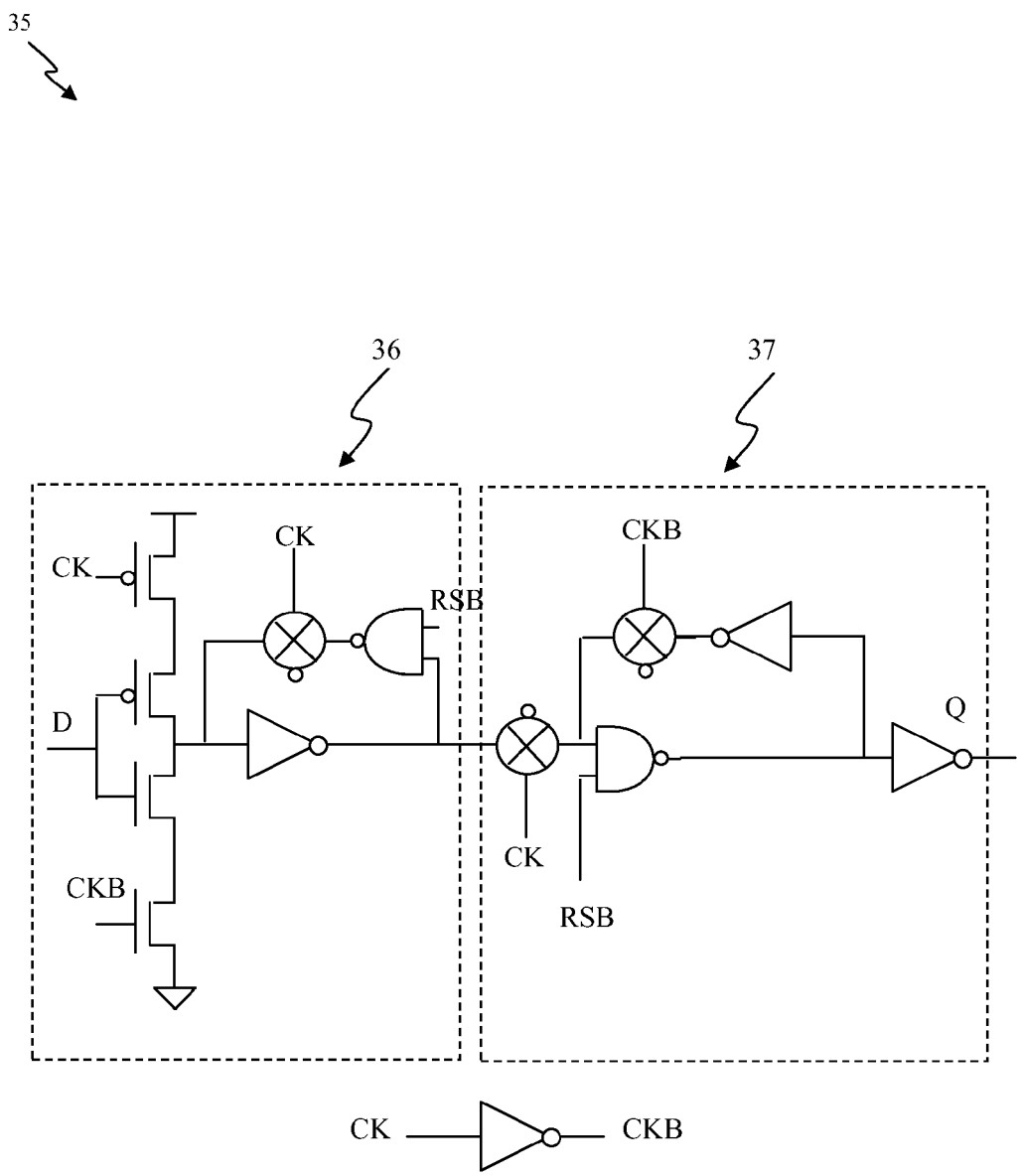
FIG. 3 shows a schematic of a conventional DFF.
Figure 4:
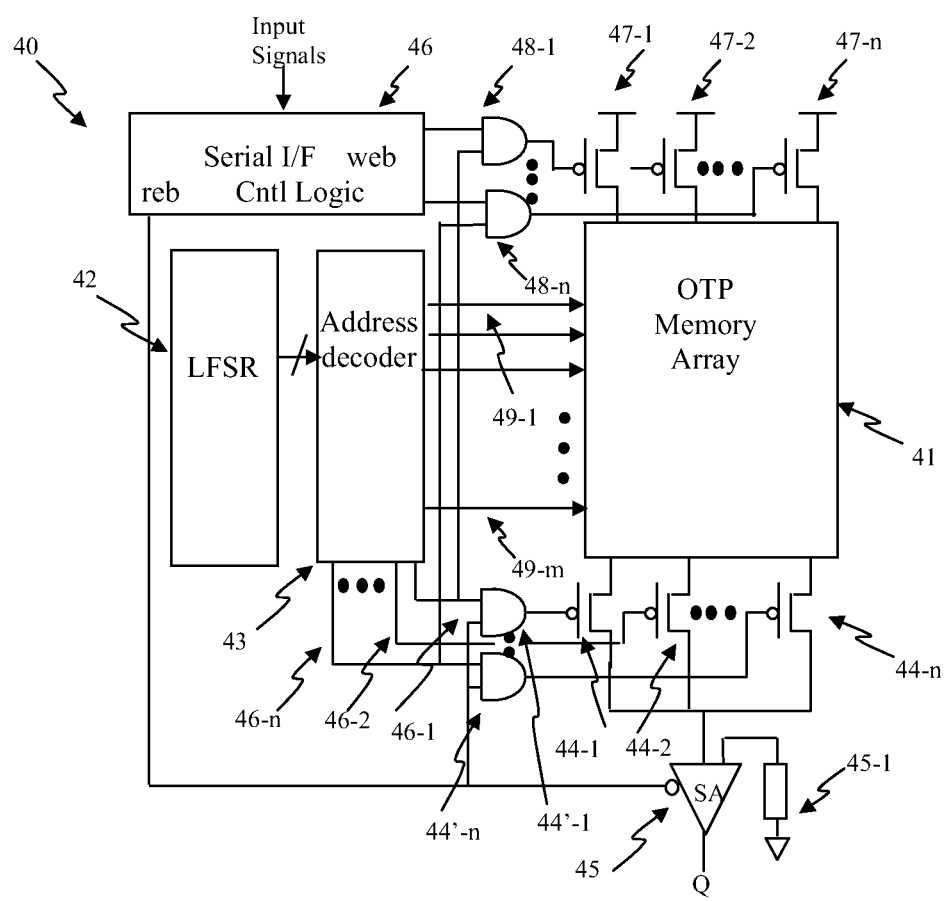
FIG. 4 shows one embodiment of a block diagram of a portion of OTP memory according to the present invention.
Figure 5A:
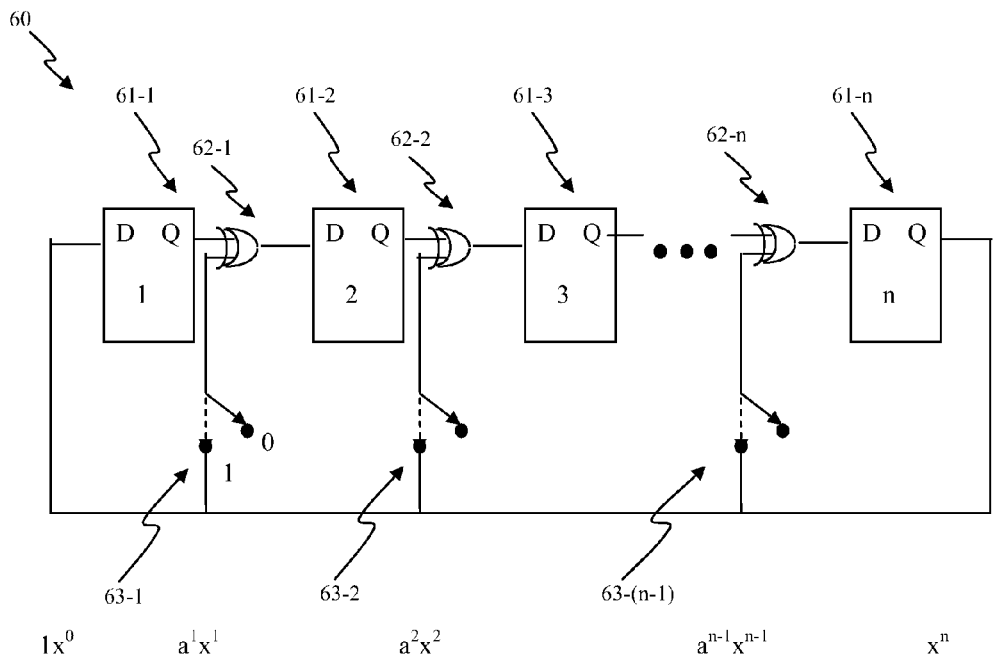
FIG. 5(a) shows a schematic of an n-bit LFSR in general.
Figure 5B:
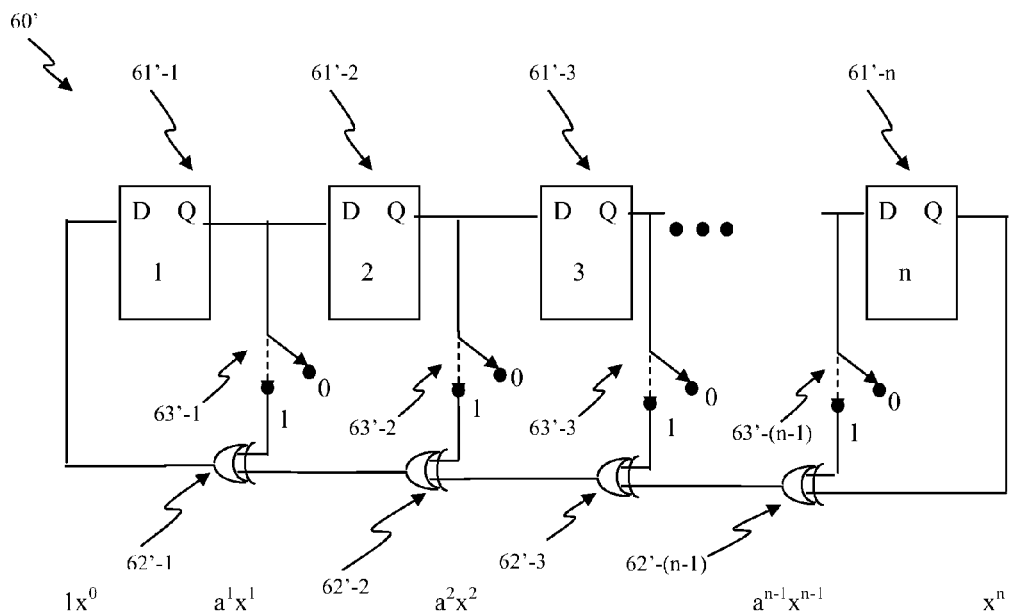
FIG. 5(b) shows a schematic of another n-bit LFSR, an equivalent design as the LFSR in FIG. 5(a).
Figure 5C:
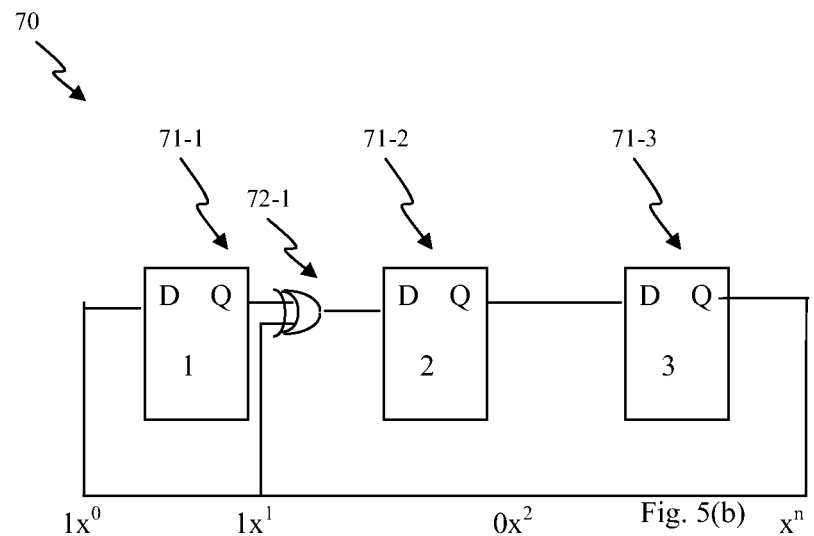
FIG. 5(c) shows a schematic of a 3-bit maximum length LFSR as an example.
Figure 5D:
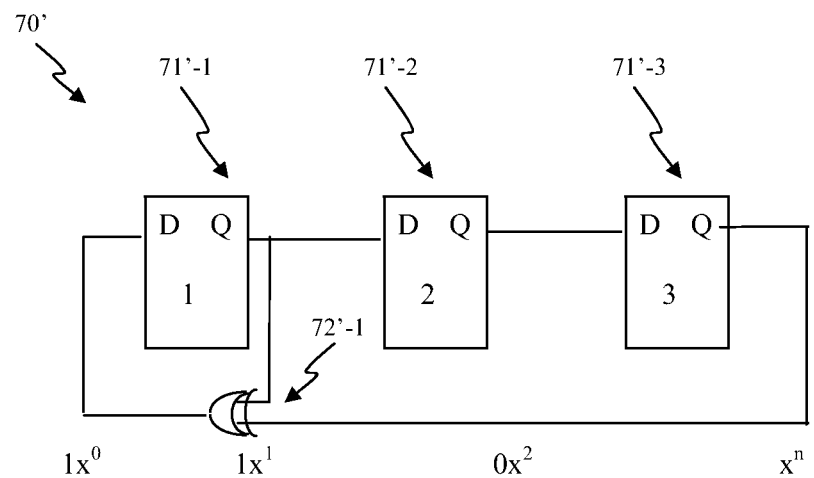
FIG. 5(d) shows a schematic of a 3-bit maximum length LFSR, an equivalent design as the LFSR in FIG. 5(b).
Figure 5E:
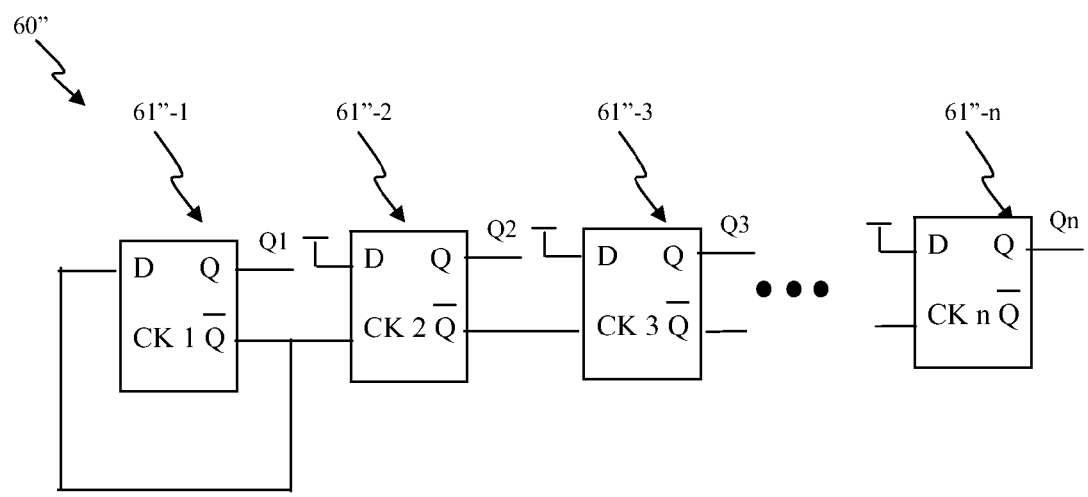
FIG. 5(e) shows a schematic of implementation efficient asynchronous counter according to one embodiment.

FIG. 4 shows a block diagram of one embodiment of a portion of an OTP memory 40 according to the present invention. The OTP memory 40 has an OTP memory array 41, at least one address decoder 43, a LFSR 42, and a serial interface control logic 46. The control logic 46 takes input signals to determine if there is a valid access. If yes, the control logic 46 sends a signal to the LFSR 42 to generate an address automatically for the address decoder 43. The address decoder 43 then enables a wordline out of the total m wordlines, 49-1 to 49-m, to select a row. Similarly, the address decoder 43 also enables at least one Y-Pass Gate select (YPGS) out of the total n YPGS selects, 46-1 to 46-n, to select at least one column. If the access is a read, the YPGS can be used to to turn on at least one Y-Pass Gate (YPG) out of the total n YPGs, 44-1 to 44-n, by ANDing with a Read Enable Bar signal (REB) in AND gates 44'-1 to 44'-n, respectively. The outputs of the YPG can be coupled to at least one sense amplifier 45 to produce an output Q. The sense amplifier 45 has a reference resistor 45-1 and can be enabled by a Read Enable Bar signal (REB) generated from the control logic 46. If the access is a write, one of the YPGS can be used to turn on at least one Y-Pass Gate Write Select out of n YPGWSs, 48-1 to 48-n, by ANDing with a Write Enable Bar (WEB) signal in AND gates, 48-1 to 48-n, respectively. The outputs of the AND gates, 48-1 to 48-n, are used to select a Y-Pass Gate Write (YPGW) out of n YPGWs, 47-1 to 47-n, to allow high voltage going into the OTP memory array 41 for programming.

FIG. 5(*a*) depicts a general Linear Feedback Shift Register (LFSR) 60 as one embodiment for generating addresses automatically. The LFSR 60 has n-registers, 61-1 through 61-n, connected in serial and wrapped around, i.e. register 61-1 is coupled to register 61-2, register 61-2 is coupled to register 61-3, and register 61-n is coupled to register 61-1, etc. Each register is coupled to the next register through an XOR, i.e. the output of 61-1 is an input to an XOR 62-1 whose output is the input of the next register 61-2. The other input of the XOR 62-1 is a switch 63-1 that can be coupled to logic 0 or 1, i.e. to ground or to the output of the last register 61-n, respectively. The switches can be hardwired to 0 or 1. With proper setting in the switches, the register outputs can be unique and can have a run length of $2^n-1$.

The operation principle of LFSR is very well known and can be found in almost any textbooks on logic design. Finding a maximum length LFSR is briefly explained as follows. A polynomial generator $x^n + a_{n-1}x^{n-1} + \ldots + a_2x^2 + a_2x + 1$ can be assigned to a LFSR, where $a_i$ is the value of the switch 62-i, i.e. $a_i=0$, if the switch 62-i is connected to logic 0, or $a_i=1$, if the switch 62-i is connected to the output of register 61-n. If the polynomial generator is primitive in the Galois Field of 2, then the LFSR can generate states with maximum length of $2^n-1$, if the initial state is not 0 for all registers.

FIG. 5(*b*) shows a schematic of an equivalent embodiment of a general LFSR 60' as the LFSR 60 shown in FIG. 5(*a*). The LFSR 60' has n-registers, 61'-1 through 61'-n, connected in serial, i.e. register 61'-1 is coupled to register 61'-2, and register 61'-2 is coupled to register 61'-3 from the output to input, etc. N XORs are placed in serial with the output of the XOR 62'-3 coupled to the input of the XOR 62'-2 and the output of the XOR 62'-2 coupled to the input of the XOR 62'-1, etc. The input of the XOR 62'-(n−1) is coupled to the output of register 61'-n and the output of the XOR 62'-1 is coupled to the input of register 61-1. The other input of the XOR 62'-i is a switch 63'-i that can be coupled to logic 0 or 1, i.e. to ground or to the output of the register 61'-i, respectively. The switches can be hardwired to 0 or 1. With proper setting in the switches, the register outputs can be unique and can run length of $2^n-1$.

FIG. 5(*c*) shows an example of a maximum length LFSR 70 with n=3. The LFSR 70 has three registers 71-1 to 71-3. The output of the register 71-3 is coupled to the input of the register 71-1. The output of the register 71-1 is coupled to an input of an XOR gate 72-1. The other input of the XOR 72-1 is coupled to the output of the register 71-3. The output of XOR 72-1 is coupled to the input of the register 71-2. The output of the register 71-2 is coupled to the input of the register 71-3. Since only the output of the register 71-1 has an XOR, the coefficient of $x^1$ is 1, while $x^2$ is 0. The coefficient of the $x^3$ and $x^0$ are always 1, so that the generator is $x^3+x+1$. This polynomial is primitive, i.e. has no other factors other than 1 and itself. Any n-bit LFSR design that has a primitive polynomial generator can have a maximum length of $2^n-1$, if the starting state is not all 0s. If this LFSR starts with 001, the next states would be 100, 010, 011, 111, 101, 110, and 001. If the LFSR starts with 000, the next states will be always 000.

FIG. 5(*d*) shows an example of another equivalent embodiment of LFSR 70', the same LFSR 70 shown in FIG. 5(*c*). The LFSR 70' has three registers 71'-1 to 71'-3. The output of the register 71'-1 is coupled to the input of the register 71'-2, and the output of the register 71'-2 is coupled to the input of the register 71'-3. An XOR gate 72'-1 has inputs from the output of register 71'-1 and 71'-3 and has the output coupled to the input of the register 71'-1. Since only the output of the register 71'-1 has an XOR, the coefficient of $x^1$ is 1, while $x^2$ is 0. The coefficient of the $x^3$ and $x^0$ are always 1, so that the generator is $x^3+x+1$.

FIG. 5(*e*) shows an example of implementation efficient asynchronous counter 60" according to one embodiment. The counter has DFF 62"-1 to 62"-n. The input D of 62"-1 is coupled to the complement output of Q1, Q1B, to toggle Q1 every cycle. The input Ds input of the DFFs 62"-2 to 62"-n are set to 1s. The complement output of Q1, Q1B is coupled to the clock of the next DFF 62"-2. The complement output of Q2, Q2B is coupled to the clock of the next DFF 62"-3. The same connection can be applied to the DFF 62"-3 through 62"-(n−1). In this configuration, the DFFs change states whenever the previous DFFs change states from 1 to 0 to realize an up-counter. Since the state changes are asynchronous to the clock, this is an asynchronous counter.

FIG. 6 lists a table of primitive polynomials with minimum numbers of XORs for n=2 to 30. If a LFSR is designed with a primitive polynomial, the states can be generated as many as a counter lesser than 1, but the total number of logic gates can be greatly reduced. The all 0s state can be prevented initially to generate a maximum length, and then this state can be multiplexed in and out any time to generate the full address space.

The above discussions about LFSR are for illustrative purposes, there are many and equivalent embodiments of LFSR designs that can achieve a maximum length of $2^n-1$. The XORs can be replaced or implemented by XNORs, NANDs, NORs, or other logic gates. Moreover, there can be many embodiments similar to LFSRs that can generate maximum length of states close to $2^n$, and that are still within the scope of this invention for those skilled in the art.

Figure 7A:
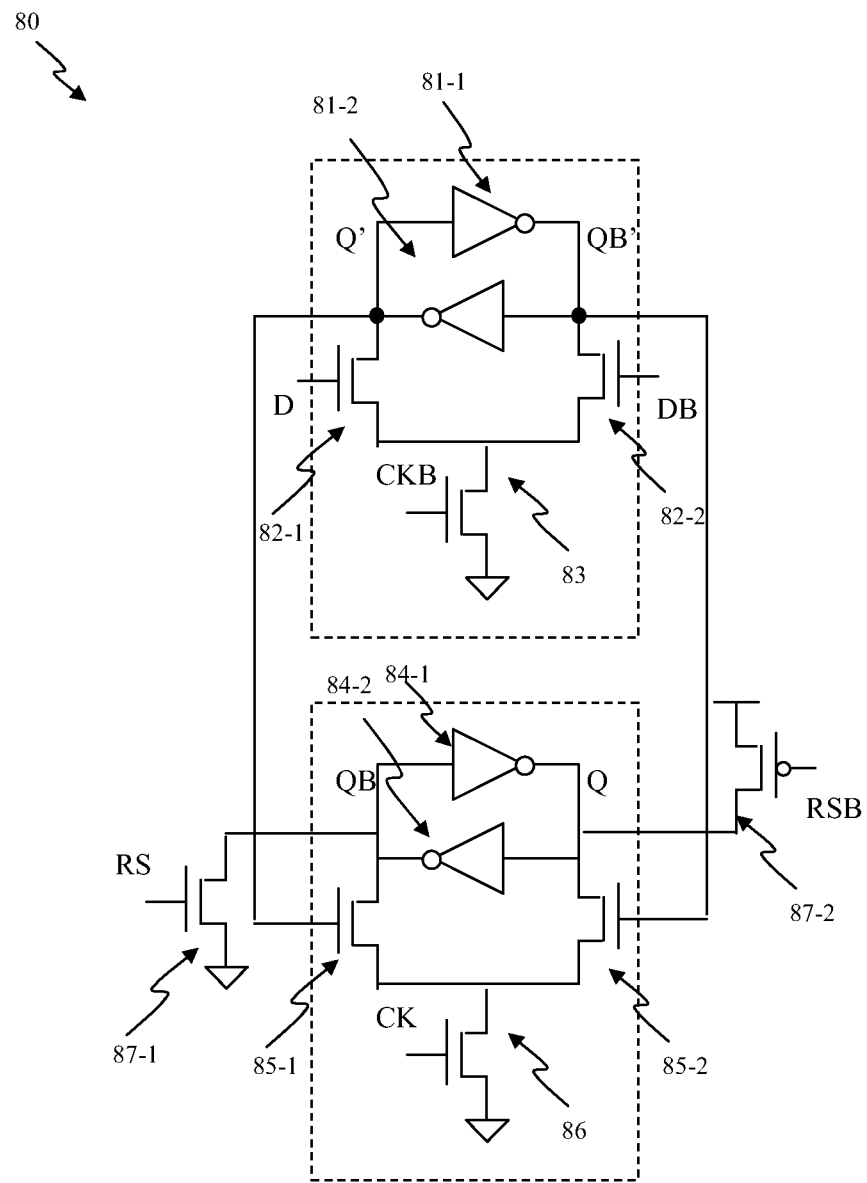
FIG. 7(a) shows a schematic of one embodiment of a DFF according to the preset embodiment.
Figure 7B:
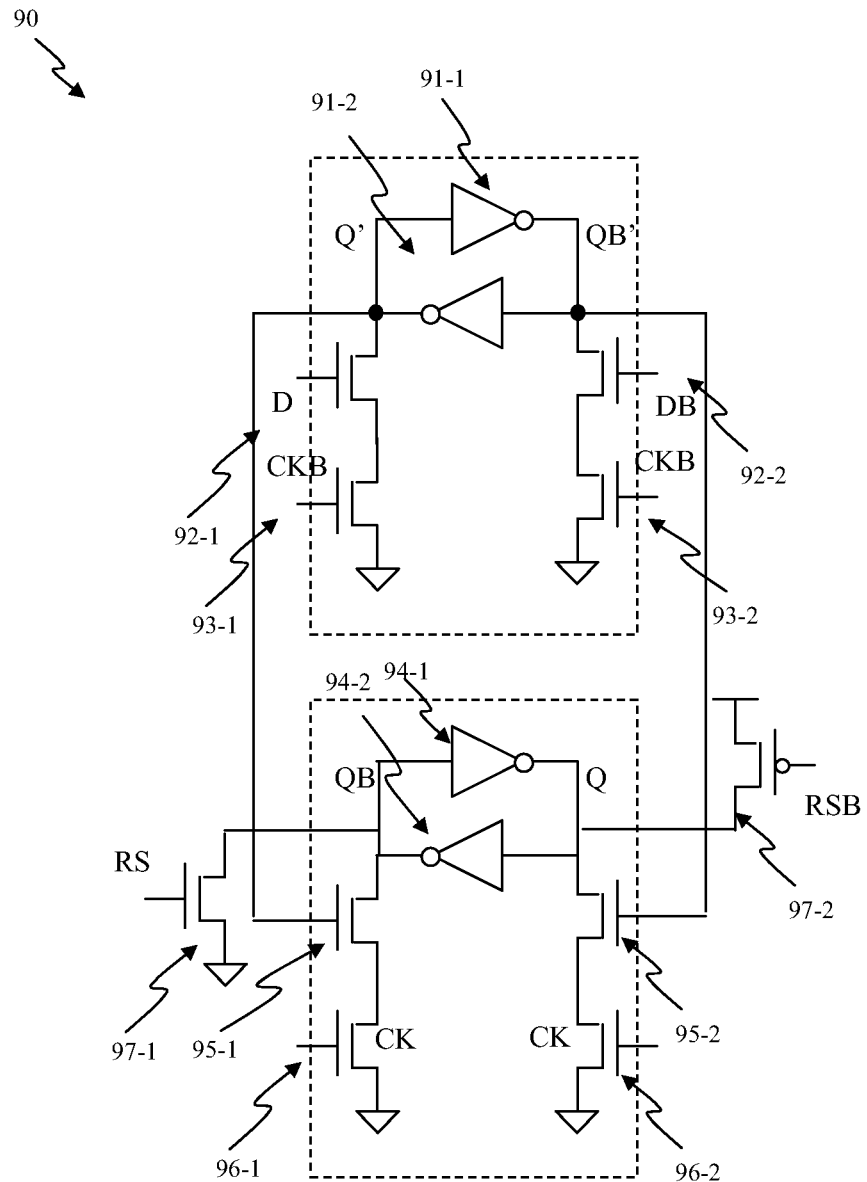
FIG. 7(b) shows a schematic of another embodiment of a DFF according to the preset embodiment.
Figure 7C:
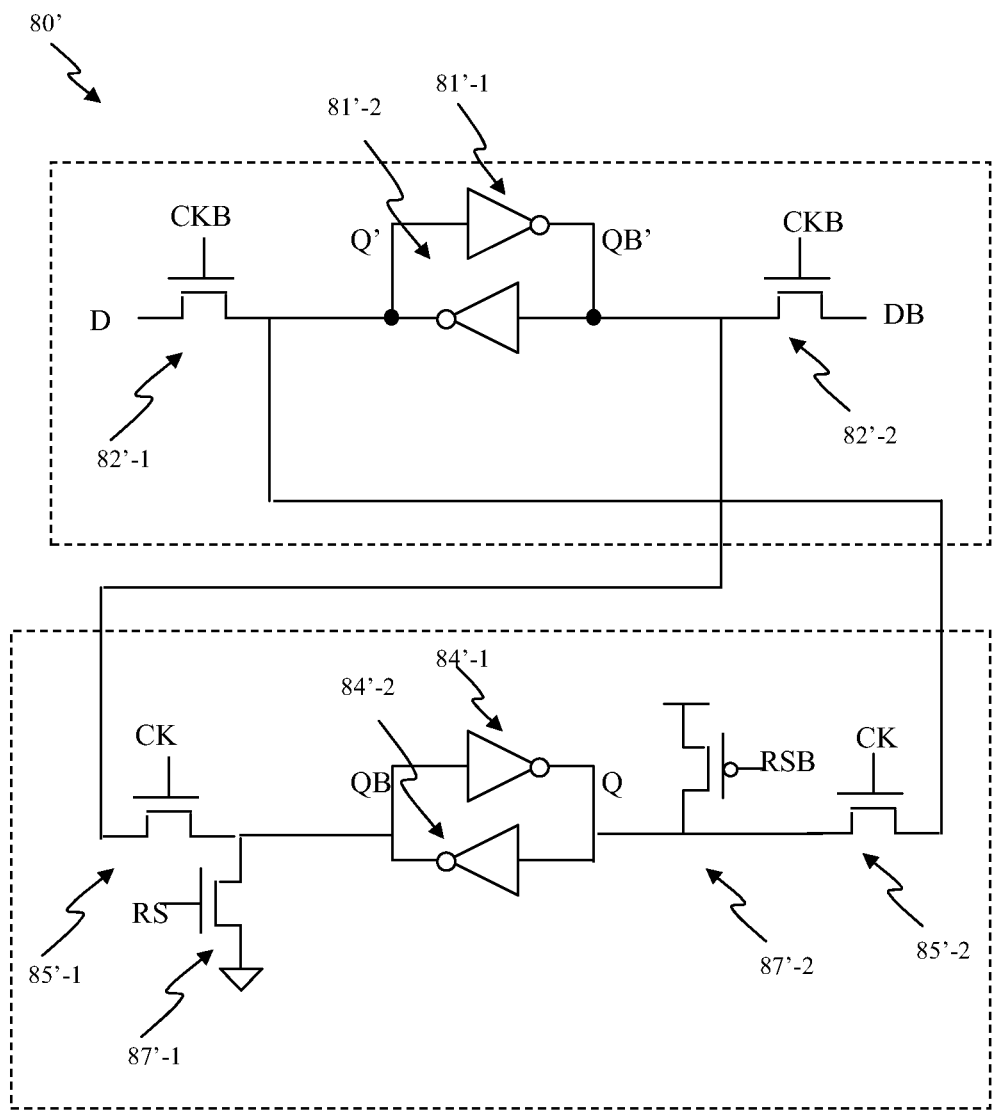
FIG. 7(c) shows a schematic of yet another embodiment of a DFF according to the preset embodiment.

FIG. 7(*a*) shows a schematic of one embodiment of a DFF 80 according to the present invention. The DFF has a first stage of latch including two cross-coupled inverters 82-1 and 82-2 having two outputs Q' and QB'. The outputs Q' and QB' are coupled to the drains of NMOS devices 82-2 and 82-1, respectively. The gates of NMOS 82-1 and 82-2 are coupled to differential inputs D and DB, respectively. Their sources are coupled through a NMOS 83, with gate coupled to CKB, to ground. The second stage of the latch includes two cross-coupled inverters 84-1 and 84-2 with two outputs Q and QB. The outputs Q and QB are coupled to the drains of NMOS devices 85-1 and 85-2, respectively. The gates of NMOS 85-1 and 85-2 are coupled to the differential outputs Q' and QB' from the first latch, respectively. The sources of 85-1 and 85-2 are coupled through a NMOS 86, with gate coupled to CK, to ground. Two MOS 87-1 and 87-2 are used to reset to the outputs Q and QB by asserting a reset RS and a reset bar RSB to the gates of the NMOS pulldown 87-1 and to the gate of the PMOS pullup 87-2, respectively. The clocks for the first and second latches have opposite phases.

FIG. 7(*b*) shows a schematic of another embodiment of a DFF 90 according to the present invention. The DFF has a first stage of latch including two cross-coupled inverters 92-1 and 92-2 with two outputs Q' and QB'. The outputs Q' and QB' are coupled to the drains of NMOS devices 92-2 and 92-1, respectively. The gates of the NMOS 92-1 and 92-2 are coupled to differential inputs D and DB, respectively. The sources of 92-1 and 92-2 are coupled to the drains of NMOS devices 93-1 and 93-2, respectively. The NMOS 93-1 and 93-2 have gates coupled to CKB and sources coupled to ground. The second stage of the latch includes two cross-coupled inverters 94-1 and 94-2 with two outputs Q and QB. The outputs Q and QB are coupled to the drains of NMOS devices 95-2 and 95-1, respectively. The gates of NMOS 95-1 and 95-2 are coupled to differential outputs QB' and Q' from the first latch, respectively. The sources of 95-1 and 95-2 are coupled to the drains of NMOS 96-1 and 96-2, respectively. The NMOS 96-1 and 96-2 have gates coupled to CK and sources coupled to ground. Two MOS 97-1 and 97-2 are used to reset to the output node Q by asserting a reset RS and a reset bar RSB to the gates of a NMOS pulldown 97-1 and to the gate of a PMOS pullup 97-2, respectively.

FIG. 7(*c*) shows a schematic of one embodiment of a DFF 80' according to the present invention. The DFF has a first stage of latch including two cross-coupled inverters 82'-1 and 82'-2 having two outputs Q' and QB'. The outputs Q' and QB' are coupled to the drains of NMOS input devices 82'-1 and 82'-2, respectively. The sources of NMOS 82'-1 and 82'-2 are coupled to differential inputs D and DB, respectively. The gates are coupled to CKB. The second stage of the latch includes two cross-coupled inverters 84'-1 and 84'-2 with two outputs Q and QB. The outputs Q and QB are coupled to the drains of NMOS devices 85'-2 and 85'-1, respectively. The sources of NMOS 85'-1 and 85'-2 are coupled to the differential outputs QB' and Q' from the first latch, respectively. The gates of 85'-1 and 85'-2 are coupled to CK. Two MOS 87'-1 and 87'-2 are used to reset to the outputs Q and QB by asserting a reset RS and a reset bar RSB to the gates of the NMOS pulldown 87'-1 and to the gate of the PMOS pullup 87'-2, respectively. The clocks for the first and second latches have opposite phases.

The DFF shown in FIGS. 7(*a*), 7(*b*), 7(*c*) are for illustrative purposes. The NMOS input and pulldown devices can be replaced by PMOS input and pullup devices. The reset devices can be a combination of NMOS or PMOS devices, or none and can be applied to the first, second, or both latches. The reset can be embodied as NAND or NOR gates instead of MOS pullup/pulldown devices. The above discussions are for exemplifying a concept of the invention. For those skilled in the art understand that there are many varieties of equivalent designs or configurations that can be embodied in part, all, or in any combinations and that are still within the scope of this invention.

Figure 8:
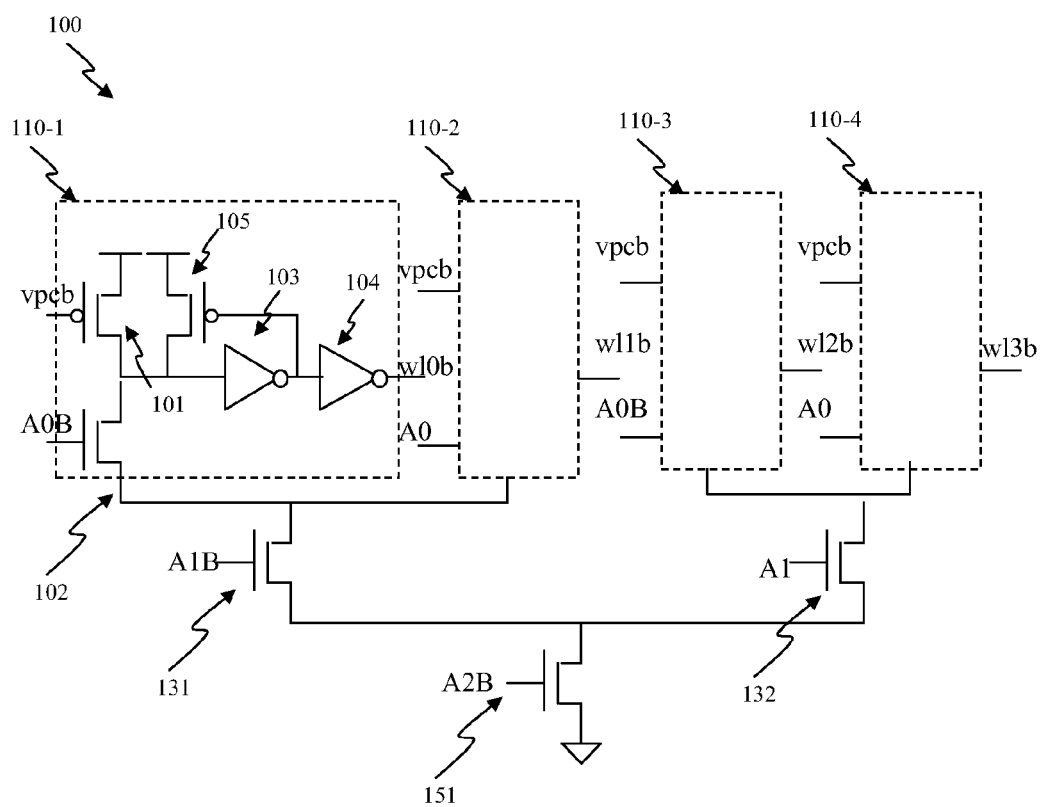
FIG. 8 shows a schematic of a tree decoder.

The gate counts of an OTP memory can be further saved by using a tree decoder. Since the decoders are mainly NAND gates with addresses and address complement signals as inputs, some of the MOS devices in the logic gates of the decoders can be shared and saved. FIG. 8 shows a schematic of a 3-input tree decoder 100 with inputs A0/A0B, A1/A1B, and A2B to illustrate the concept. A decoder with A0B, A1B, and A2B has a PMOS pullup 101 coupled to three NMOS devices 102, 131, and 151 in serial to ground, which have gates coupled to A0B, A1B, and A2B, respectively. The drain of the PMOS 101 is coupled to an inverter 103, whose output node P is coupled to another inverter 104. The output of 104 is a wordline bar, WL0B, to select a row in the OTP memory. The node P is also coupled to a gate of another PMOS pullup 105 to hold the drain of PMOS 101. To save power, the gate of the 101 VPCB is usually a pre-charge signal waiting for addresses A0B, A1B, and A2B becoming ready to evaluate the decoding. Once the evaluation is done, the pre-charge signal VPCB is released to let the gate 105 to hold the node, if the decoder is evaluated not true, i.e. not all addresses A0B/A1B/A2B are high. The circuits 110, including 102, 101, 105, 103, and 104, can be replicated 3 times to generate the other wordline signals WL1B, WL2B, and WL3B, respectively, with the gates of the pulldown NMOS devices coupled to A0/A1B/A2B, A0B/A1/A2B, and A0/A1/A2B, respectively. Since the gates of the NMOS having sources coupled to ground are all coupled to A2B, they can be shared as a single NMOS shown as 151. By the same token, the gates of the pulldown NMOS having sources coupled to the drain of NMOS 151 can be shared as NMOS 131 and 132, whose gates are coupled to A1B and A1, respectively. With proper sharing, only the circuit block 110 needs to be replicated for the other three decoders to generate WL1B, WL2B, and WL3B, respectively. The same concept can be applied to the other decoders associated with A2 input, or to have more stacks in serial, or to the Y-decoder, etc.

Figure 9:
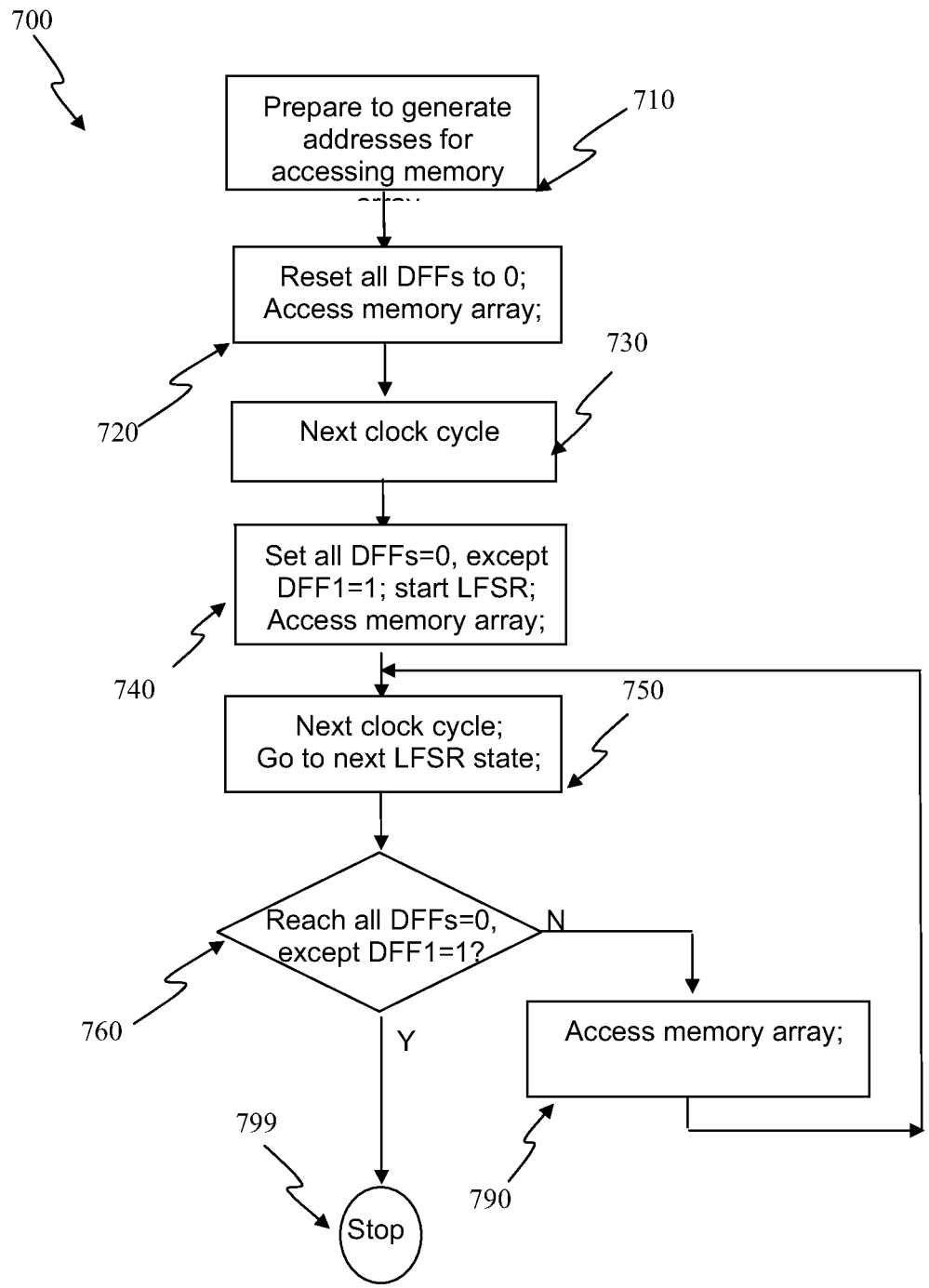
FIG. 9 depicts a method in a flow chart to use LFSR to generate addresses for an OTP memory.

FIG. 9 shows a flow chart 700 depicting a method to generate addresses in serial to access an OTP memory using a maximum-length LFSR, according to one embodiment. The procedure starts at 710 to prepare generating addresses to access the OTP memory. Then reset all DFFs to 0 and access the memory in the step 720. In the next clock cycle in step 730, set all DFFs=0 except DFF1=1 as a starting address for a LFSR in step 740. In the next cycle, go to the next LFSR state in step 750. Then, check if the new address in the LFSR goes around and reaches the starting address in step 760. If yes, stop the address generation since all possible addresses have been reached. If no, access the memory array in step 790 and go back to step 750 for the next clock cycle and the next LFSR state. This process continues until the checking in step 760 is affirmative, then the process stops in 799.

The flow chart shown in FIG. 9 depicting an address generation method 700 for an OTP memory in accordance with certain embodiments. The method 700 is described in the context an OTP memory, such as the OTP memory 41 in FIG. 4. In addition, although described as a flow of steps, one of ordinary skilled in the art will recognize that at least some of the steps may be performed in a different order, including simultaneously, or skipped.

Figure 10:
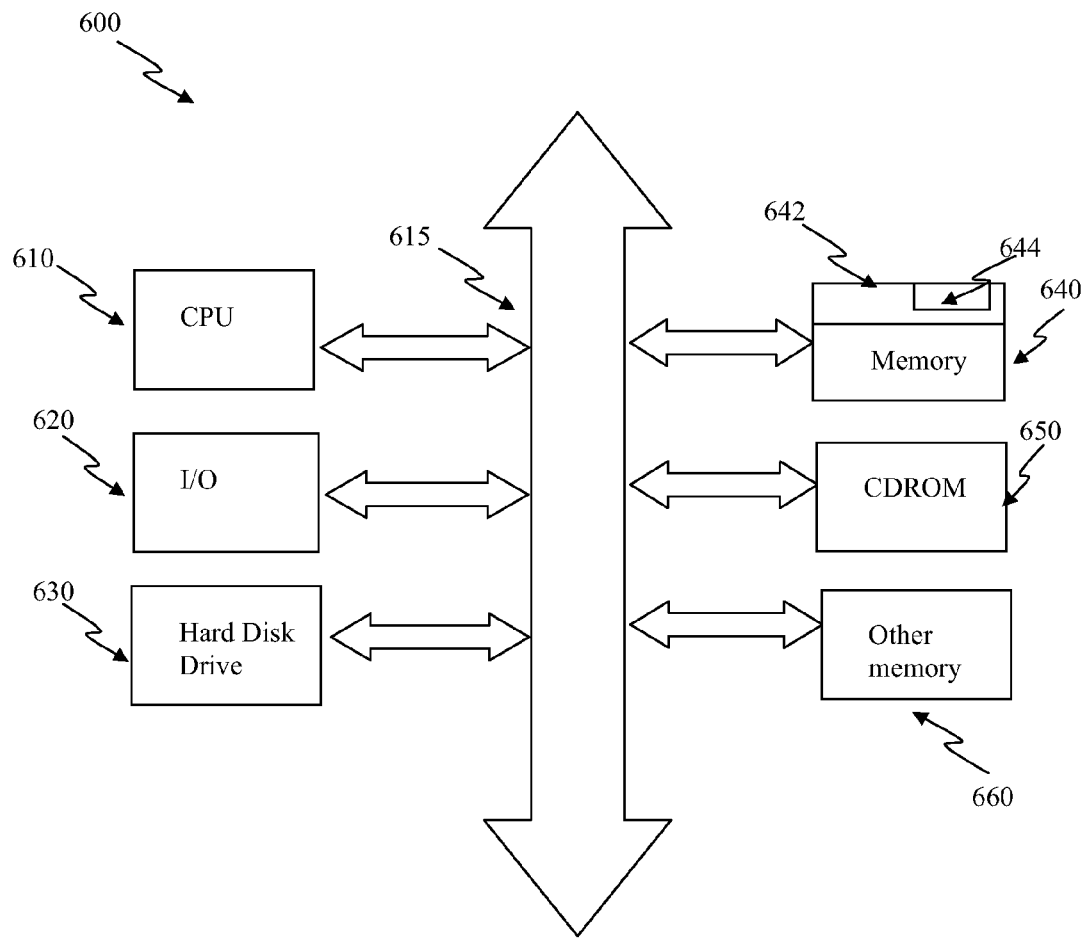
FIG. 10 shows a processor system using OTP memory according to one embodiment.

FIG. 10 shows a processor system 600 according to one embodiment. The processor system 600 can include an OTP device 644, such as in a cell array 642, in OTP memory 640, according to one embodiment. The processor system 600 can, for example, pertain to a computer system. The computer system can include a Central Process Unit (CPU) 610, which communicate through a common bus 615 to various memory and peripheral devices such as I/O 620, hard disk drive 630, CDROM 650, OTP memory 640, and other memory 660. Other memory 660 is a conventional memory such as SRAM, DRAM, or flash, typically interfaces to CPU 610 through a memory controller. CPU 610 generally is a microcontroller, microprocessor, a digital signal processor, or other programmable digital logic devices. Memory 640 is preferably constructed as an integrated circuit, which includes the memory array 642 having at least one OTP device 644. The memory 640 typically interfaces to CPU 610 through a memory controller. If desired, the memory 640 may be combined with the processor, for example CPU 610, in a single integrated circuit.

The invention can be applied to any OTP memory that has OTP cells including an OTP element coupled to at least one program selectors. The OTP element can be a fuse or anti-fuse. The fuse can be an interconnect fuse or a single or plural of contact/via fuse. The interconnect fuse can include polysilicon, silicided polysilicion, silicide, polymetal, metal, metal alloy, thermally isolated active region, or some combinations thereof. One of the most common fuse is a CMOS gate used as an interconnect. The anti-fuse can be a contact/via with dielectric in between, or a CMOS gate coupled to a CMOS body with gate oxide in between. A diode can be used as program selector. The diode can be a junction diode constructed from a P+ active region on N well and an N+ active region on the same N well as the P and N terminals of the diode, respectively. In another embodiment, a diode can be constructed from a polysilicon structure with two ends implanted by P+ and N+ implants, respectively, In yet another embodiment, the diode can be an isolated active region with two ends implanted by P+ and N+ implants, respectively. The P or N terminal of junction, polysilicon, or active region diode can be implanted by the same source or drain implant in CMOS devices. Either the junction diode, polysilicon diode, or active region diode can be built in standard CMOS processes without any additional masks or process steps.

The invention can be implemented in a part or all of an integrated circuit in a Printed Circuit Board (PCB), or in a system. The OTP memory device can be fuse, (such as interconnect, contact, or via fuse) or anti-fuse. The interconnect fuse can be silicided or non-silicided polysilicon fuse, metal fuse, or thermally isolated active region fuse. The anti-fuse can be a gate-oxide breakdown anti-fuse, contact or via anti-fuse with dielectrics in-between. Though the program mechanisms are different, their logic states can be distinguished by different resistance values and can only be programmed once.

Additional information on programmable memory structures and their formation and usage can be found in: (1) U.S. patent application Ser. No. 13/026,650, filed on Feb. 14, 2011 and entitled "CIRCUIT AND SYSTEM FOR USING A POLYSILICON DIODE AS PROGRAM SELECTOR FOR RESISTIVE DEVICES IN CMOS LOGIC PROCESSES," which is hereby incorporated herein by reference; (2) U.S. patent application Ser. No. 13/026,725, filed on Feb. 14, 2011 and entitled "CIRCUIT AND SYSTEM FOR USING A JUNCTION DIODE AS PROGRAM SELECTOR FOR RESISTIVE DEVICES," which is hereby incorporated herein by reference; (3) U.S. patent application Ser. No. 13/026,725, filed on Feb. 14, 2011 and entitled "CIRCUIT AND SYSTEM OF USING JUNCTION DIODE AS PROGRAM SELECTOR FOR RESISTIVE DEVICES IN CMOS LOGIC PROCESSES," which is hereby incorporated herein by reference; (4) U.S. patent application Ser. No. 13/026,650, filed on Feb. 14, 2011 and entitled "CIRCUIT AND SYSTEM OF USING POLYSILICON DIODE AS PROGRAM SELECTOR FOR RESISTIVE DEVICES IN CMOS LOGIC PROCESSES," which is hereby incorporated herein by reference; and (5) U.S. patent application Ser. No. 13/471,704, filed on May 15, 2012 and entitled "CIRCUIT AND SYSTEM FOR USING A JUNCTION DIODE AS PROGRAM SELECTOR FOR ONE-TIME PROGRAMMABLE DEVICES," which is hereby incorporated herein by reference.

The above description and drawings are only to be considered illustrative of exemplary embodiments, which achieve the features and advantages of the present invention. Modifications and substitutions of specific process conditions and structures can be made without departing from the spirit and scope of the present invention.

The many features and advantages of the present invention are apparent from the written description and, thus, it is intended by the appended claims to cover all such features and advantages of the invention. Further, since numerous modifications changes will readily occur to those skilled in the art, it is not desired to limit the invention to the exact construction and operation as illustrated and described. Hence, all suitable modifications and equivalents may be resorted to as falling within the scope of the invention.

What is claimed is:

1. A One-Time Programmable (OTP) memory, comprising:
   a plurality of OTP cells, at least one of the OTP cells comprising an OTP element fabricated in standard CMOS process;
   at least one address generator having a plurality of registers constructed as shift registers with the last shift register coupled to the first shift register and operating at each clock cycle; and
   at least one Exclusive OR (XOR) or equivalent gate being coupled (i) to provide an output that serves as an input to one of the shift registers, (ii) to receive as a first input an output from one of the shift registers, and (iii) to receive as a second input an output from another of the shift registers or from a set logic level,
   wherein the output of the shift registers being used as an address to access the OTP memory in each clock cycle.

2. An OTP memory as recited in claim 1, wherein the address generator is a Linear Feedback Shift Register (LFSR) with maximum length to generate $2^n-1$ address spaces from an n-bit address.

3. An OTP memory as recited in claim 1, wherein the address generator is a Linear Feedback Shift Register (LFSR) with maximum length to generate $2^n-1$ address spaces from an n-bit address and has the last state coupled between any states to generate the entire $2^n$ address spaces from an n-bit address.

4. An OTP memory as recited in claim 1, wherein the OTP memory has bit count no more than 256 bits.

5. An OTP memory as recited in claim 1, wherein the registers used in the address generator has two latches, and wherein each of the latches has two cross-coupled inverters with two outputs coupled to the drains of two MOS input devices, respectively.

6. An OTP memory as recited in claim 1, wherein the addresses from the address generator are further coupled to at least one tree decoder to access the OTP memory array.

7. An OTP memory as recited in claim 1, wherein the OTP element is a fuse that includes at least one of polysilicon, silicided polysilicon, silicide, polymetal, metal, metal alloy, thermally isolated active region, contact, or via.

8. An OTP memory as recited in claim 1, wherein the OTP element is an anti-fuse that includes at least one of contact/via with dielectric in between or gate and MOS body with gate oxide in between.

9. An OTP memory as recited in claim 1, wherein at least one OTP cell has at least one program selector that is a junction diode constructed from an active region in a CMOS well, and wherein the two terminals of the junction diode are implanted with the same source or drain implant in a CMOS process.

10. An OTP memory as recited in claim 1, wherein at least one OTP cell has at least one program selector that is a polysilicon diode built on a polysilicon structure, and wherein the two ends of the polysilicon diode are implanted with the same source or drain implant in a CMOS process to serve as two terminals of the diode.

11. An OTP memory as recited in claim 1, wherein at least one OTP cell has at least one program selector that is a diode built on an isolated active region, and wherein the two ends of the active region are implanted with the same source or drain implant in a CMOS process to serve as two terminals of the diode.

12. An electronic system, comprising:
a processor; and
an OTP memory operatively connected to the processor, the OTP memory includes at least a plurality of OTP cells for providing data storage, each of the OTP cells comprising an OTP element coupled to at least one program selectors fabricated in a standard CMOS process;
at least one address generator having a plurality of registers constructed as shift register with the last shift register coupled to the first shift register and operating at each clock cycle; and
at least one Exclusive OR (XOR) or equivalent gate being coupled (i) to provide an output that serves as an input to one of the shift registers, (ii) to receive as a first input an output from one of the shift registers, and (iii) to receive as a second input an output from another of the shift registers or from a set logic level,
wherein the output of the shift registers being used as an address to access the OTP memory in each clock cycle.

13. An electronic system as recited in claim 12, wherein the address generator is a Linear Feedback Shift Register (LFSR) with maximum length to generate $2^n-1$ address spaces from an n-bit address.

14. An electronic system as recited in claim 12, wherein the registers used in the address generator has two latches, and wherein each of the latches has two cross-coupled inverters with two outputs coupled to the drains of two MOS input devices, respectively.

15. An electronic system as recited in claim 12, wherein the address from the address generator is further coupled to at least one tree decoder to access the OTP memory array.

16. An electronic system as recited in claim 12, wherein the program selector in the OTP memory cell is a junction diode constructed from an active region in a CMOS well, and wherein the two terminals of the junction diode are implanted with the same source or drain implant in a CMOS process.

17. A method for providing a One-Time Programmable (OTP) memory, comprising:
providing a plurality of OTP cells, at least one of the OTP cells include at least one OTP element coupled to at least one program selector fabricated in a standard CMOS process, at least one address generator operating at each clock cycle having a plurality of registers constructed as shift registers with the output of the last register coupled to the input of the first register, and at least one Exclusive OR (XOR) or equivalent gate being coupled (i) to provide an output that serves as an input to one of the shift registers, (ii) to receive as a first input an output from one of the shift registers, and (iii) to receive as a second input an output from another of the shift registers or from a set logic level; and
accessing the OTP cells using the outputs of the registers as an address at each clock cycle.

* * * * *